(12) United States Patent
Tsujiuchi et al.

(10) Patent No.: US 9,608,108 B2
(45) Date of Patent: Mar. 28, 2017

(54) SEMICONDUCTOR DEVICE AND METHOD FOR MANUFACTURING THE SAME

(71) Applicant: Renesas Electronics Corporation, Tokyo (JP)

(72) Inventors: Mikio Tsujiuchi, Tokyo (JP); Kouji Tanaka, Tokyo (JP); Yasuki Yoshihisa, Tokyo (JP); Shunji Kubo, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 14/835,373

(22) Filed: Aug. 25, 2015

(65) Prior Publication Data

US 2016/0064559 A1 Mar. 3, 2016

(30) Foreign Application Priority Data

Aug. 27, 2014 (JP) ................. 2014-173064

(51) Int. Cl.
| | |
|---|---|
| *H01L 29/66* | (2006.01) |
| *H01L 29/78* | (2006.01) |
| *H01L 29/08* | (2006.01) |
| *H01L 29/40* | (2006.01) |
| *H01L 29/417* | (2006.01) |
| *H01L 21/265* | (2006.01) |
| *H01L 29/06* | (2006.01) |
| *H01L 29/10* | (2006.01) |

(52) U.S. Cl.
CPC ...... *H01L 29/7835* (2013.01); *H01L 29/0847* (2013.01); *H01L 29/0873* (2013.01); *H01L 29/404* (2013.01); *H01L 29/407* (2013.01); *H01L 29/4175* (2013.01); *H01L 29/66659* (2013.01); *H01L 29/66689* (2013.01); *H01L 29/7816* (2013.01); *H01L 21/26586* (2013.01); *H01L 29/0653* (2013.01); *H01L 29/1083* (2013.01); *H01L 29/1087* (2013.01)

(58) Field of Classification Search
None
See application file for complete search history.

(56) References Cited

U.S. PATENT DOCUMENTS

| | | | |
|---|---|---|---|
| 7,439,122 B2 * | 10/2008 | Shimizu | H01L 21/763 257/48 |
| 2006/0081836 A1 * | 4/2006 | Kimura | H01L 21/823412 257/19 |
| 2012/0043608 A1 | 2/2012 | Yang et al. | |

FOREIGN PATENT DOCUMENTS

JP 09-321291 A 12/1997

OTHER PUBLICATIONS

J. Sonsky, et al., "Towards universal and voltage-scalable high gate- and drain-voltage MOSFETs in CMOS", ISPSD, 2009, pp. 315-318.

(Continued)

*Primary Examiner* — Reema Patel
(74) *Attorney, Agent, or Firm* — Sughrue Mion, PLLC

(57) ABSTRACT

A semiconductor substrate has a main surface with an n type offset region having a trench portion formed of a plurality of trenches extending in a direction from an $n^+$ drain region toward an $n^+$ source region. The plurality of trenches each have a conducting layer therein extending in the main surface in the direction from the $n^+$ drain region toward the $n^+$ source region.

18 Claims, 43 Drawing Sheets

(56) References Cited

OTHER PUBLICATIONS

A. Heringa, et al., "Novel power transistor design for a process independent high voltage option in standard CMOS", ISPSD, Jun. 4-8, 2006, Naples, Italy.

* cited by examiner

SEMICONDUCTOR DEVICE AND METHOD FOR MANUFACTURING THE SAME

This nonprovisional application is based on Japanese Patent Application No. 2014-173064 filed on Aug. 27, 2014 with the Japan Patent Office, the entire contents of which are hereby incorporated by reference.

BACKGROUND OF THE INVENTION

Field of the Invention

The present invention relates to a semiconductor device and a method for manufacturing the same.

Description of the Background Art

High breakdown voltage lateral metal oxide semiconductor (MOS) transistors are described for example in the following documents:
Document 1: US Patent Application Publication No. 2012/0043608
Document 2: Japanese Patent Laying-Open No. 9-321291
Document 3: J. Sonsky, et al., "Towards universal and voltage-scalable high gate- and drain-voltage MOSFETs in CMOS", ISPSD 2009, pp. 315-318
Document 4: A. Heringa, et al., "Novel power transistor design for a process independent high voltage option in standard CMOS", ISPSD 2006.

Document 1 and Document 4 describe disposing a plurality of shallow trench isolations (STIs) between a gate electrode and a drain region in stripes. Document 2 describes providing between a gate electrode and a drain region a trench with an impurity containing insulating material introduced therein. Document 3 discloses a structure having an STI with a gate electrode disposed thereon.

SUMMARY OF THE INVENTION

Documents 1, 2, 3 and 4 do not describe a configuration allowing reduced on resistance and enhanced breakdown voltage to be both established sufficiently.

Other issues and novel features will be apparent from the present specification and the accompanying drawing.

In one embodiment, a semiconductor substrate has a main surface having an offset region with a trench portion formed to extend in a direction from a drain region toward a source region. The trench portion has a conducting layer therein extending in the main surface in a direction from the drain region toward the source region.

The above one embodiment allows reduced on resistance and enhanced breakdown voltage to be both established at a high level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, the present invention will be described in embodiments with reference to the drawings.

First Embodiment

Figure 1:
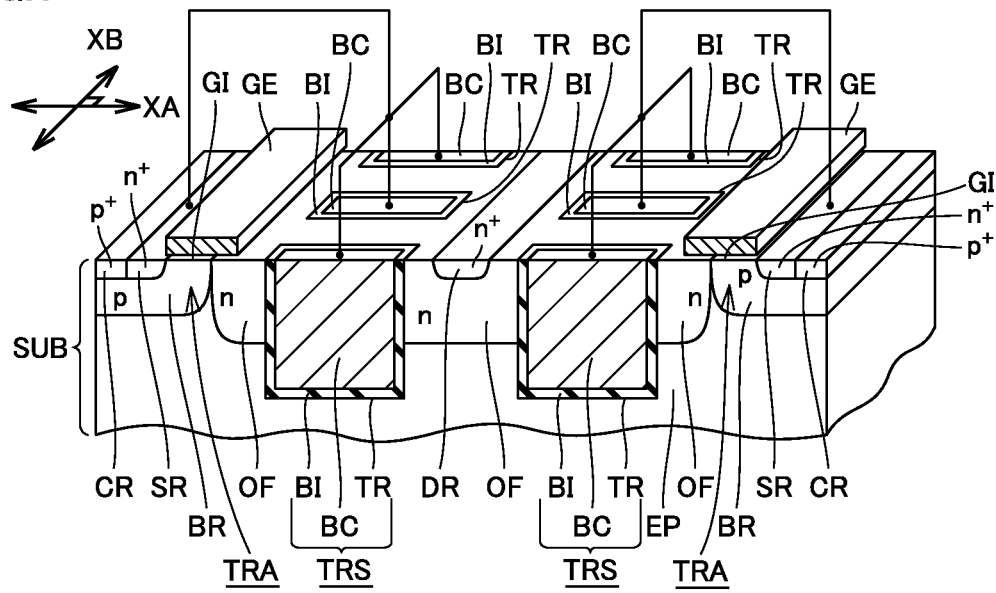
FIG. 1 is a schematic perspective view of a configuration of a semiconductor device in a first embodiment.
Figure 2:
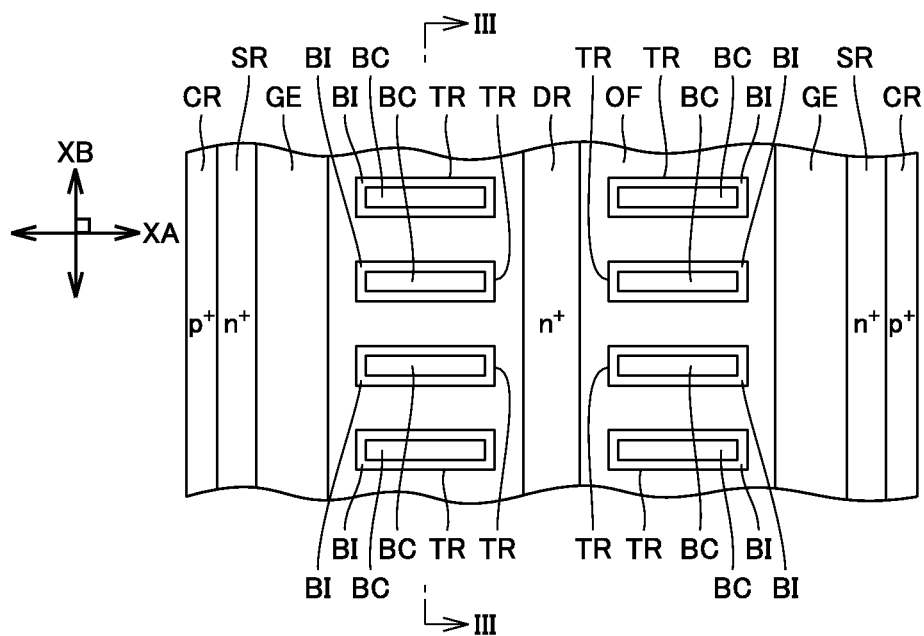
FIG. 2 is a plan view of a configuration of the semiconductor device shown in FIG. 1.
Figure 3:
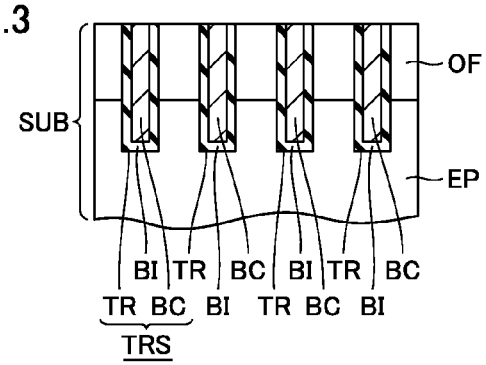
FIG. 3 is a schematic cross section taken along a line III-III shown in FIG. 2.

With reference to FIG. 1 to FIG. 3, the present embodiment provides a semiconductor device having a high breakdown voltage lateral MOS transistor TRA. Lateral MOS transistor TRA is formed in a semiconductor substrate SUB and has an n$^+$ source region SR, an n$^+$ drain region DR, an n type offset region OF, a p type body region BR, a p$^+$ contact region CR, a gate insulating layer GI, and a gate electrode GE.

P type body region BR is formed in a main surface of semiconductor substrate SUB. N$^+$ source region SR is formed in the main surface of semiconductor substrate SUB in p type body region BR. P$^+$ contact region CR is formed in the main surface of semiconductor substrate SUB in p type body region BR and adjacent to the n$^+$ source region. P$^+$ contact region CR has a p type impurity concentration higher than that of p type body region BR.

N type offset region OF is formed in the main surface of semiconductor substrate SUB and adjacent to p type body region BR. N$^+$ drain region DR is formed in the main surface of semiconductor substrate SUB in n type offset region OF. N$^+$ drain region DR together with n$^+$ source region SR sandwiches p type body region BR and n type offset region OF and is thus located in the main surface of semiconductor substrate SUB separated from n$^+$ source region SR.

N type offset region OF has a portion in the main surface of semiconductor substrate SUB located between n$^+$ drain region DR and n$^+$ source region SR. N type offset region OF together with n$^+$ source region SR sandwiches the p type body region in the main surface of semiconductor substrate SUB, and is thus located in the main surface of semiconductor substrate SUB separated from n$^+$ source region SR. N$^+$ drain region DR and n$^+$ source region SR have an n type impurity concentration higher than that of n type offset region OF.

Gate electrode GE is formed on the main surface of semiconductor substrate SUB opposite to a region sandwiched between n$^+$ source region SR and n type offset region OF (i.e., p type body region BR), with gate insulating layer GI posed therebetween.

The semiconductor device of the present embodiment has a trench resurf structure TRS. Trench resurf structure TRS has a trench portion formed of a plurality of trenches TR, and a conducting layer BC and a surrounding insulating layer BI formed in each trench TR.

The trench portion formed of the plurality of trenches TR is formed in the main surface of semiconductor substrate SUB in n type offset region OF. The trench portion extends from the main surface of semiconductor substrate SUB through n type offset region OF to a position deeper than n type offset region OF. Accordingly, the trench portion has a bottom wall in a region below n type offset region OF (e.g., a p type epitaxial region EP).

The plurality of trenches TR configuring the trench portion each extend in the main surface of semiconductor substrate SUB in a direction XA from n$^+$ drain region DR toward n$^+$ source region SR. The plurality of trenches TR configuring the trench portion are mutually separated and run parallel and are for example formed parallel to one another.

Preferably, direction XA is a direction orthogonal to a direction XB in which n$^+$ drain region DR or n$^+$ source region SR extends in the main surface of semiconductor substrate SUB. The direction orthogonal to direction XB also includes a direction offset therefrom by a production error.

Conducting layer BC is formed in the trench portion (or the plurality of trenches TR). Conducting layer BC extends in the main surface of semiconductor substrate SUB in direction XA. Conducting layer BC is formed such that a fixed potential is applied thereto. Conducting layer BC is for example electrically connected to n⁺ source region SR so that a source potential is applied thereto. The source potential is a ground potential for example.

Conducting layer BC is made of tungsten (W), copper (Cu) or a similar metal or an alloy thereof. Furthermore, other than conducting layer BC, a barrier metal layer made of titanium (Ti), titanium nitride (TiN), tantalum (Ta), tantalum nitride (TaN) or the like may be formed in the trench portion (or the plurality of trenches TR). Furthermore, conducting layer BC may be made of polycrystalline silicon having an impurity introduced therein (hereafter referred to as "doped polysilicon").

Surrounding insulating layer BI is formed in the trench portion to surround conducting layer BC. Surrounding insulating layer BI covers a side surface of conducting layer BC and a bottom surface of conducting layer BC. Thus, surrounding insulating layer BI is located between conducting layer BC and semiconductor substrate SUB, and conducting layer BC and semiconductor substrate SUB are not in direct contact with each other. Surrounding insulating layer BI is made of silicon oxide for example.

Figure 4A:
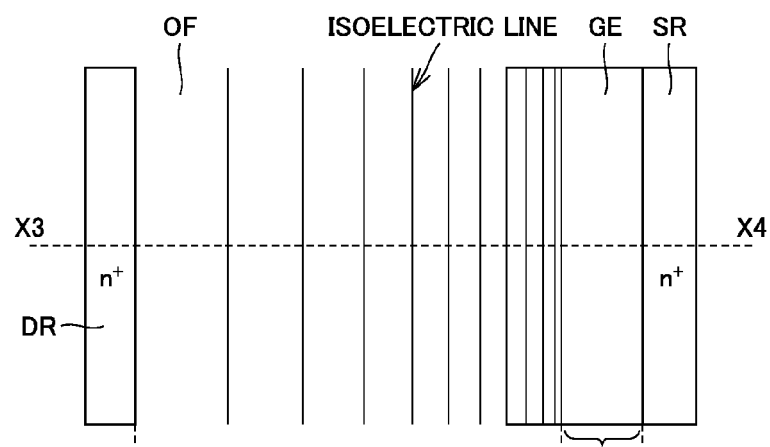
FIG. 4A is a plan view representing a distribution of isoelectric lines presented when voltage is applied to a drain in a comparative example 1 having an offset region without a trench resurf structure.
Figure 4B:
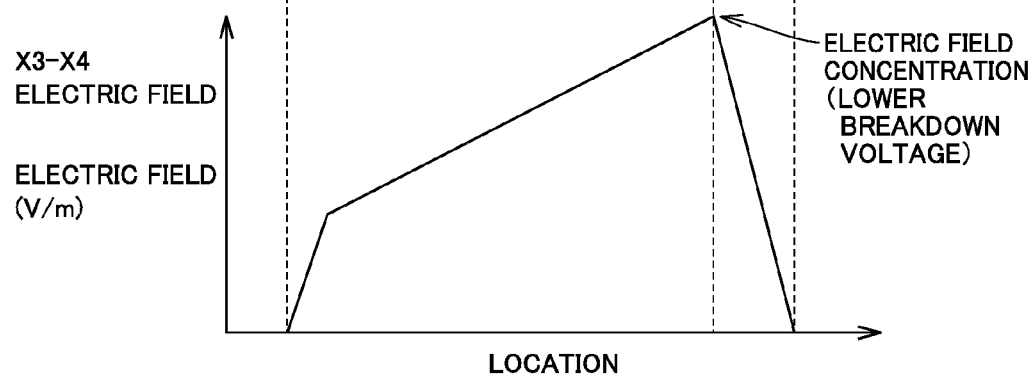
FIG. 4B represents an electric field distribution presented when voltage is applied to the drain in comparative example 1 having the offset region without the trench resurf structure.
Figure 5A:
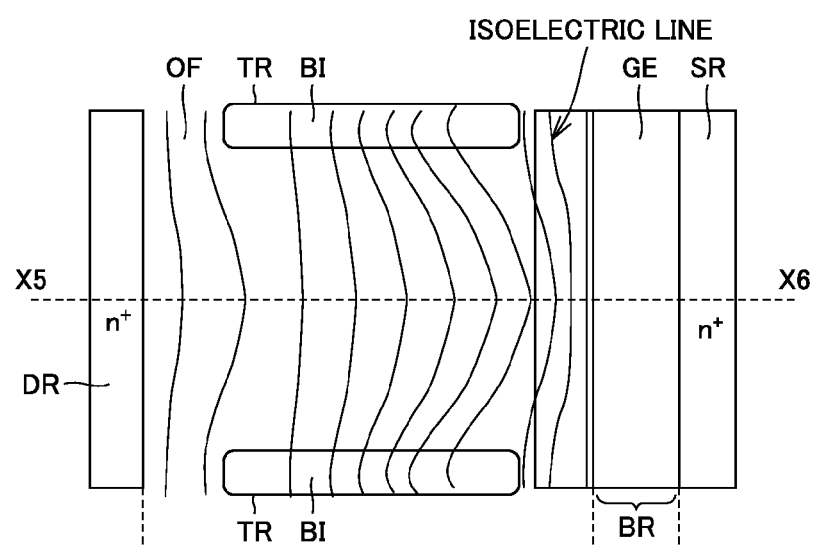
FIG. 5A is a plan view representing a distribution of isoelectric lines presented when voltage is applied to a drain in a comparative example 2 having an offset region with a plurality of trenches formed therein in stripes having an insulating film buried therein.
Figure 5B:
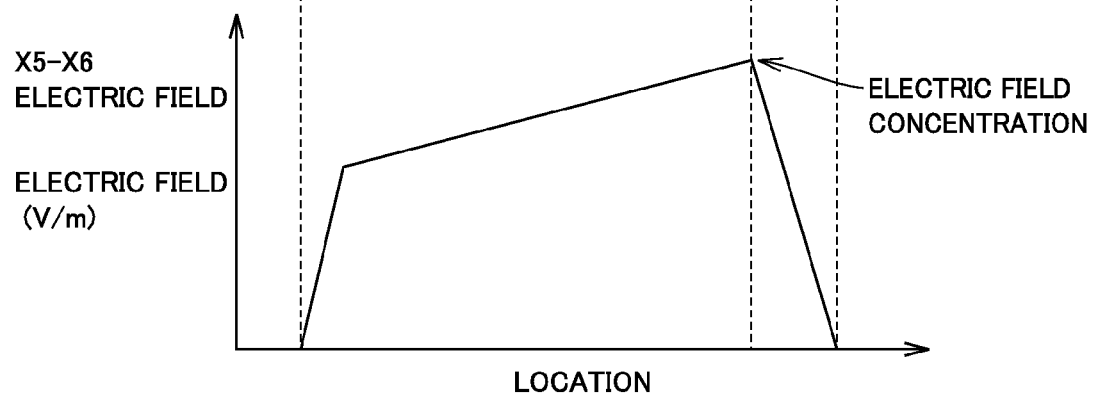
FIG. 5B represents an electric field distribution presented when voltage is applied to the drain in comparative example 2 having the offset region with the plurality of trenches formed therein in stripes having the insulating film buried therein.

The present embodiment has a function and effect, as will be described hereinafter with reference to FIGS. 4A and 4B showing a comparative example 1 and FIGS. 5A and 5B showing a comparative example 2 in comparison.

With reference to FIG. 4A, comparative example 1 presents the configuration of the present embodiment shown in FIGS. 1-3 minus trench resurf structure TRS. Comparative example 1 presents isoelectric lines spaced closer as they approach n⁺ source region SR from n⁺ drain region DR. Thus, as shown in FIG. 4B, an electric field is presented that is higher as it approaches n⁺ source region SR from n⁺ drain region DR. N type offset region OF and p type body region BR has a junction, at which the electric field is maximized by Gauss' law, and concentrates at this junction. The electric field concentration results in reduced breakdown voltage.

With reference to FIG. 5A, comparative example 2 presents the configuration of the present embodiment shown in FIGS. 1-3, with trench resurf structure TRS having trench TR with surrounding insulating layer BI alone introduced therein and no conducting layer introduced therein. Comparative example 2 is affected by a potential distribution caused in trench TR having surrounding insulating layer BI introduced therein and can thus present a resurf effect of some extent. Thus, as shown in FIG. 5B, comparative example 2 presents an electric field increasing, as seen from n⁺ drain region DR toward n⁺ source region SR, at a smaller rate than comparative example 1 does. However, comparative example 2 also presents the electric field maximized and thus concentrating at the junction of n type offset region OF and p type body region BR. The electric field concentration results in reduced breakdown voltage.

Figure 6A:
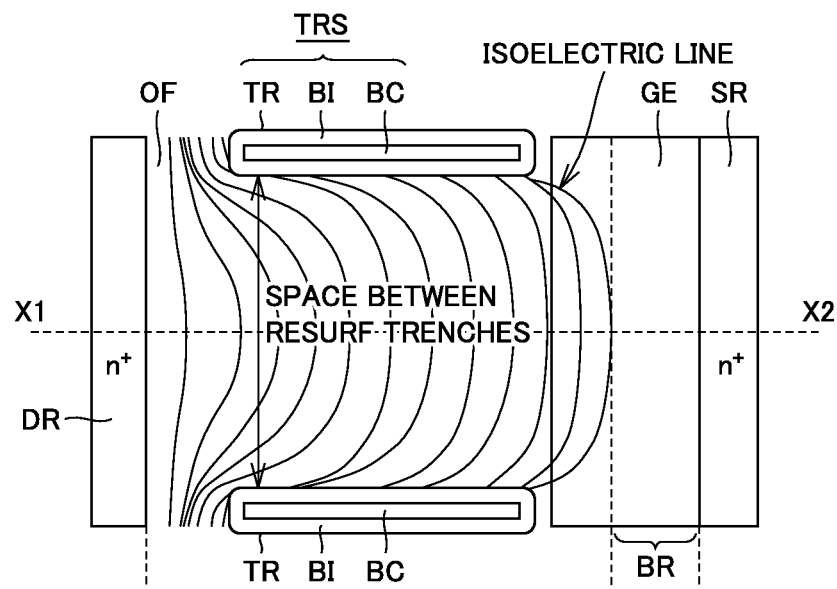
FIG. 6A is a plan view representing a distribution of isoelectric lines presented in the first embodiment when voltage is applied to a drain.
Figure 6B:
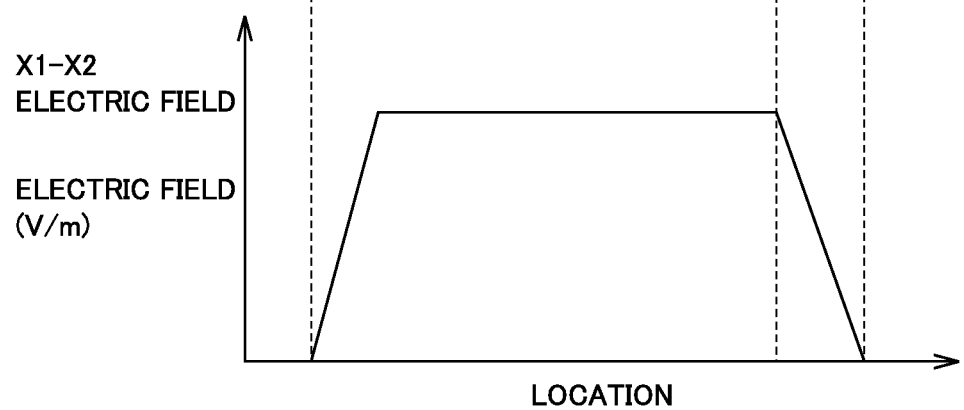
FIG. 6B represents an electric field distribution presented in the first embodiment when voltage is applied to the drain.

With reference to FIG. 6A, the present embodiment provides trench resurf structure TRS having trench TR with conducting layer BC therein. Conducting layer BC allows a sufficient resurf effect to be obtained, and thus allows isoelectric lines to be drawn towards n⁺ drain region DR and thus equally spaced. This allows an electric field from n⁺ drain region DR to n⁺ source region SR to be controlled to be uniform and thus allows an electric field concentration at a junction of n type offset region OF and p type body region BR to be alleviated. This allows reduced on resistance and enhanced breakdown voltage to be both established at a high level.

Figure 7:
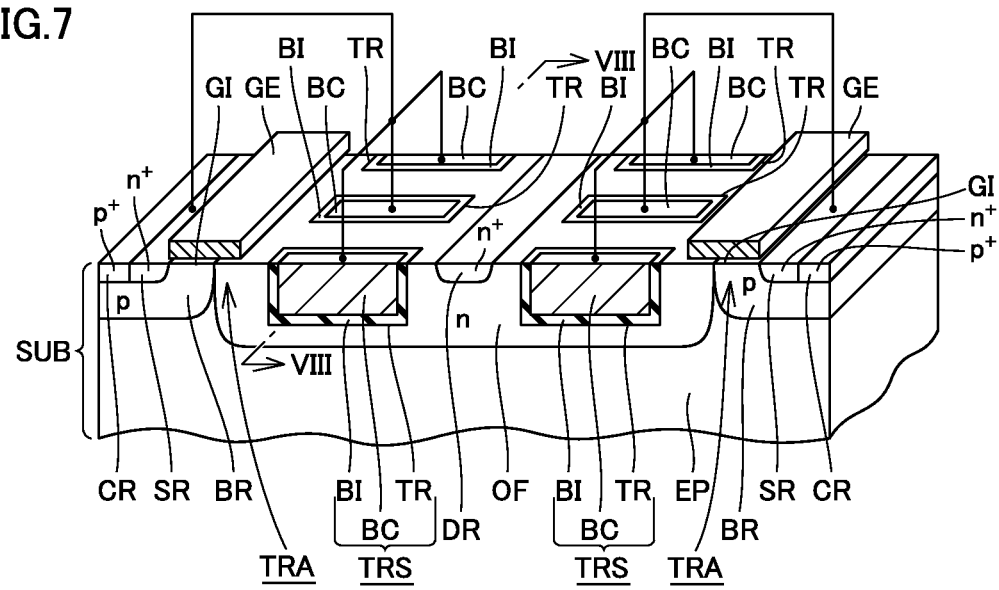
FIG. 7 is a schematic perspective view of the semiconductor device in the first embodiment having a trench resurf structure with a trench portion having a bottom wall in an offset region.
Figure 8:
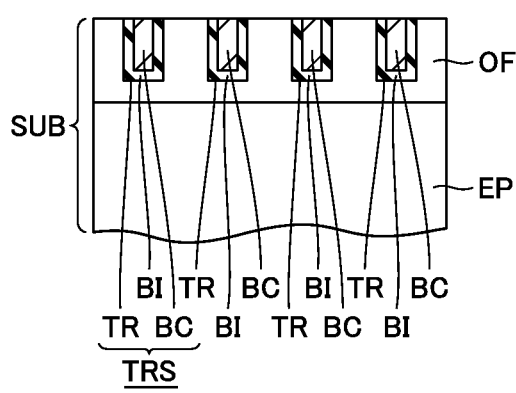
FIG. 8 is a schematic cross section taken along a line VIII-VIII shown in FIG. 7.

Furthermore, FIGS. 1-3 show a trench portion configured of a plurality of trenches TR each formed to extend from the main surface of semiconductor substrate SUB deeply, which can increase the resurf effect. In contrast, FIGS. 7 and 8 show trench TR shallower than n type offset region OF and thus having a bottom wall located within n type offset region OF, which can also present the resurf effect.

Note that a larger resurf effect can also be obtained by optimally spacing trenches TR and optimizing n type offset region OF in impurity concentration.

Furthermore, trench TR has surrounding insulating layer BI therein, and surrounding insulating layer BI covers a side surface of conducting layer BC and a bottom surface of conducting layer BC to allow conducting layer BC to be out of contact with semiconductor substrate SUB. Surrounding insulating layer BI can thus electrically isolate conducting layer BC from n type offset region OF.

Furthermore, trench TR penetrates n type offset region OF and thus extends below n type offset region OF. This allows a resurf effect to be presented across n type offset region OF depthwise.

Furthermore, conducting layer BC is configured to allow a fixed potential to be applied thereto. This allows a potential that is required to allow conducting layer BC to cause the resurf effect to be applied to conducting layer BC.

Furthermore, conducting layer BC is electrically connected to n⁺ source region SR. This allows conducting layer BC to be brought to a source potential and can facilitate obtaining the resurf effect. Note that the potential of conducting layer BC is not limited to the source potential, as long as the resurf effect can be obtained.

Furthermore, the trench portion is formed of a plurality of trenches TR provided in the main surface of semiconductor substrate SUB mutually separated and running parallel. This helps to draw isoelectric lines between trenches TR toward the drain, as has been described above, and can further facilitate equally spacing the isoelectric lines.

Hereafter will be described second to ninth embodiments each having the same technological idea as the first embodiment and having high breakdown voltage lateral MOS transistor TRA and trench resurf structure TRS that are similar to those of the first embodiment. The second to ninth embodiments present semiconductor devices, respectively, as will successively be described hereafter.

Second Embodiment

Figure 9:
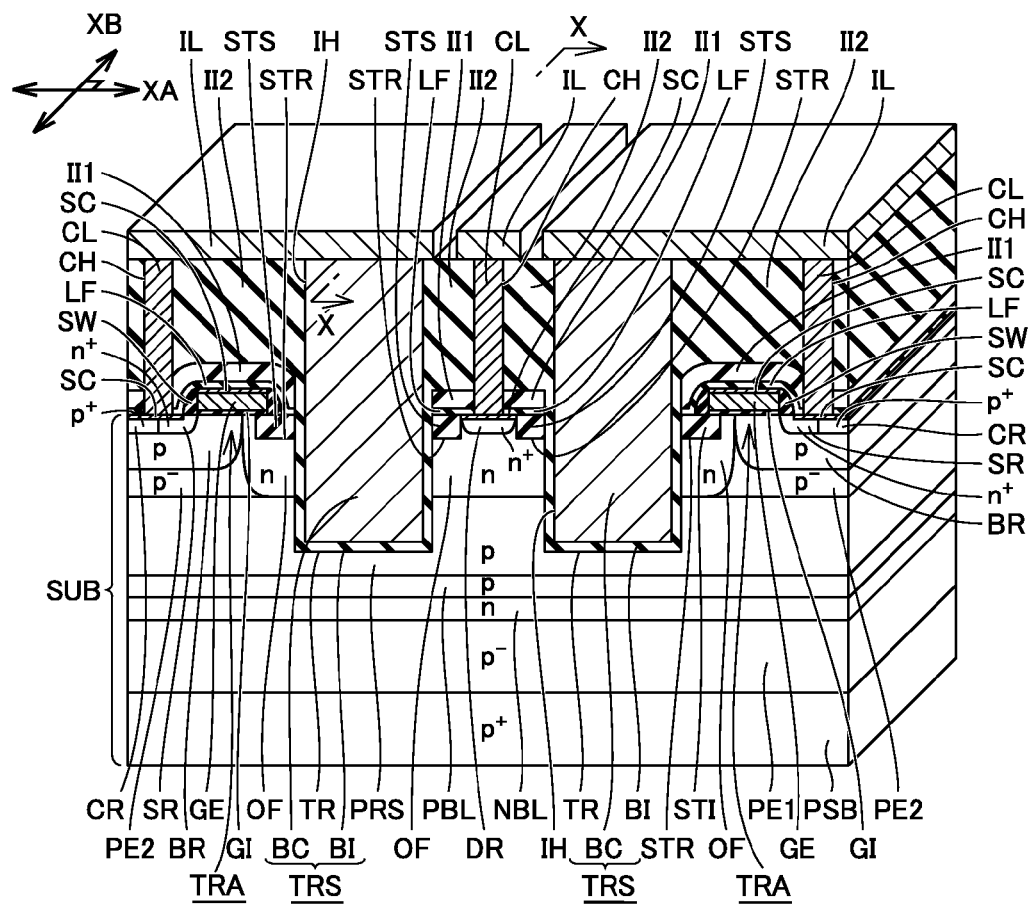
FIG. 9 is a schematic perspective view of a configuration of a semiconductor device in a second embodiment.
Figure 10:
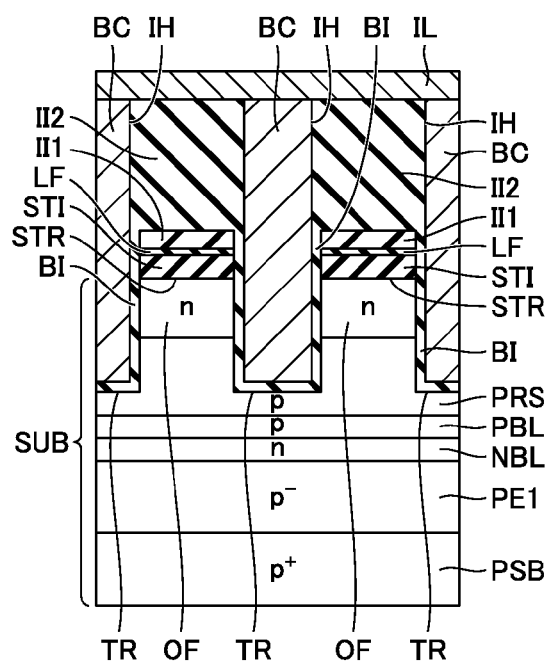
FIG. 10 is a schematic cross section taken along a line X-X shown in FIG. 9.

With reference to FIG. 9 and FIG. 10, semiconductor substrate SUB has a p⁺ substrate region PSB, a p⁻ epitaxial region PE1, an n type buried region NBL, a p type buried region PBL, a p type resurf region PRS, and a p⁻ epitaxial region PE2 which are laminated in order from the bottom.

P⁻ epitaxial region PE1 is formed in contact with p⁺ substrate region PSB and has a p type impurity concentration lower than that of p⁺ substrate region PSB. N type buried region NBL is formed in contact with p⁻ epitaxial region PE1. P type buried region PBL is formed in contact with n type buried region NBL. N type buried region NBL and p type buried region PBL are device isolating impurity regions for electrically isolating lateral MOS transistor TRA formed in the main surface of semiconductor substrate SUB from other devices.

Preferably, n type buried region NBL and p type buried region PBL each have a floating potential. For some applications, however, n type buried region NBL and p type buried region PBL may each be electrically connected to n⁺ drain region DR and have a drain potential. Furthermore, one of n type buried region NBL and p type buried region PBL may be absent and the other may alone be present.

P type resurf region PRS is formed in contact with p type buried region PBL and has a p type impurity concentration lower than that of p type buried region PBL. P⁻ epitaxial region PE2 is formed in contact with p type resurf region PRS and has a p type impurity concentration lower than that of p type resurf region PRS. Lateral MOS transistor TRA is formed on p type resurf region PRS and p⁻ epitaxial region PE2.

The present embodiment provides lateral MOS transistor TRA similar in configuration to lateral MOS transistor TRA of the first embodiment. Lateral MOS transistor TRA includes n type offset region OF located on p type resurf region PRS in contact with p type resurf region PRS. N type offset region OF and p type resurf region PRS have a pn junction surface extending substantially parallel to the main surface of semiconductor substrate SUB. N type offset region OF is adjacent to p⁻ epitaxial region PE2.

Lateral MOS transistor TRA includes p type body region BR on p⁻ epitaxial region PE2 in contact with p⁻ epitaxial region PE2. P type body region BR has a p type impurity concentration higher than that of p⁻ epitaxial region PE2.

In the main surface of semiconductor substrate SUB in n type offset region OF an STI structure is formed. The STI structure has a trench STR formed in the main surface of semiconductor substrate SUB, and an insulating layer STS buried in trench STR.

The STI structure has trench STR smaller in depth than n type offset region OF. Furthermore, the STI structure is formed in the main surface of semiconductor substrate SUB between n⁺ drain region DR and gate electrode GE. Gate electrode GE may partially overlie the STI structure. The STI structure is formed in the main surface of semiconductor substrate SUB to surround or sandwich n⁺ drain region DR.

A silicide layer SC is formed on gate electrode GE, n⁺ drain region DR, n⁺ source region SR, and p⁺ contact region CR. Silicide layer SC is formed in contact with gate electrode GE, n⁺ drain region DR, n⁺ source region SR, and p⁺ contact region CR.

A sidewall insulating layer SW is formed to cover a side wall of gate electrode GE. Furthermore, a liner insulating layer LF and an interlayer insulating layers Il1 and Il2 are formed on the main surface of semiconductor substrate SUB to cover lateral MOS transistor TRA.

Trench resurf structure TRS of the present embodiment is thus similar in configuration to trench resurf structure TRS of the first embodiment, and has a trench portion formed of a plurality of trenches TR, and conducting layer BC and surrounding insulating layer BI formed in each trench TR. Trench resurf structure TRS has the plurality of trenches TR forming the trench portion, which extends through the STI structure and n type offset region OF to a position deeper than n type offset region OF. The trench portion has a bottom wall below n type offset region OF.

The trench portion extends in the main surface of semiconductor substrate SUB in direction XA from n⁺ drain region DR toward n⁺ source region SR. The plurality of trenches TR configuring the trench portion are mutually separated and run parallel and are for example formed parallel to one another.

Interlayer insulating layer Il2 is formed on a side wall of trench TR and a bottom wall of trench TR. Interlayer insulating layer Il2 is provided with a hole IH extending from an upper surface of interlayer insulating layer Il2 into trench TR. Conducting layer BC is buried in hole IH.

Interlayer insulating layer Il2 in trench TR is formed to surround conducting layer BC, and configures surrounding insulating layer BI of the first embodiment. Surrounding insulating layer BI covers a side surface of conducting layer BC and a bottom surface of conducting layer BC to prevent conducting layer BC from being in direct contact with semiconductor substrate SUB. Surrounding insulating layer BI is made of silicon oxide for example.

Conducting layer BC extends in the main surface of semiconductor substrate SUB in direction XA. Conducting layer BC is formed such that a fixed potential is applied thereto. Conducting layer BC is for example electrically connected to n⁺ source region SR so that a source potential is applied thereto. Specifically, conducting layer BC is electrically connected to n⁺ source region SR with silicide layer SC, a conducting layer CL, and an interconnect layer IL therebetween.

Conducting layer CL is buried in a contact hole CH. Contact hole CH extends from an upper surface of interlayer insulating layer Il2 through interlayer insulating layers Il1, Il2, and liner insulating layer LF to reach silicide layer SC. Interconnect layer IL is formed on an upper surface of interlayer insulating layer Il2.

The configuration of the present embodiment other than the above is substantially the same as that of the first embodiment shown in FIG. 1 to FIG. 3, and accordingly, identical components are identically denoted and will not be described repeatedly.

Hereinafter reference will be made to FIGS. 11-20 to describe a method for manufacturing the semiconductor device of the present embodiment.

Figure 11:
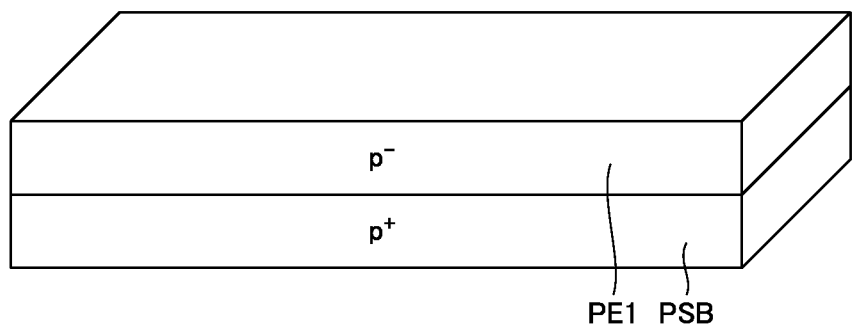
FIGS. 11-20 are schematic perspective views showing first to tenth steps, respectively, of a method for manufacturing the semiconductor device in the second embodiment.

With reference to FIG. 11, initially, p⁺ substrate region PSB having a relatively high p type impurity concentration is prepared as a semiconductor substrate. On p⁺ substrate region PSB, normal epitaxy is employed to form p⁻ epitaxial region PE1 having a p type impurity concentration lower than that of p⁺ substrate region PSB.

Figure 12:
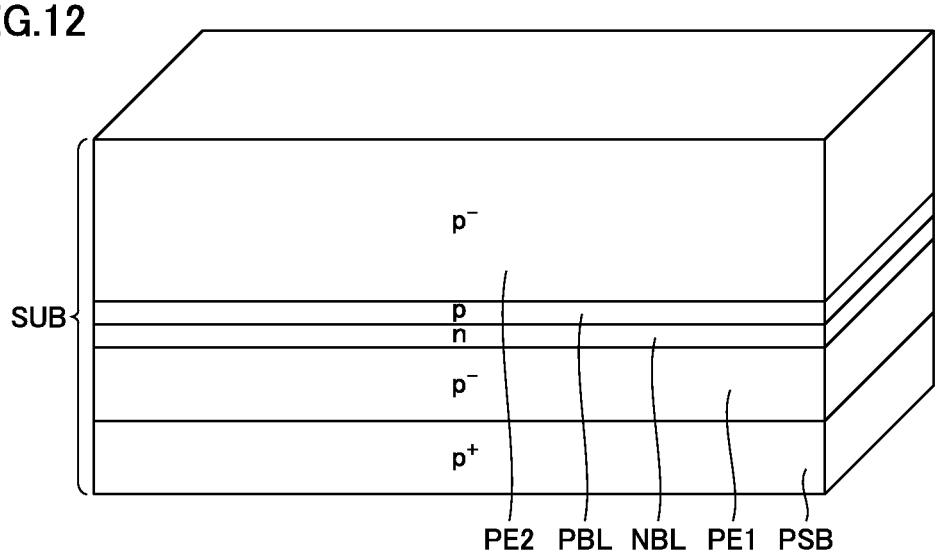

With reference to FIG. 12, normal ion injection is employed to introduce an n type impurity into p⁻ epitaxial region PE1. Thus, n type buried region NBL is formed on p⁻ epitaxial region PE1. Normal ion injection is employed to introduce a p type impurity into n type buried region NBL. Thus, p type buried region PBL is formed on n type buried region NBL. On p type buried region PBL, normal epitaxy is employed to form p⁻ epitaxial region PE2 having a p type impurity concentration lower than that of p⁺ substrate region PSB.

Figure 13:
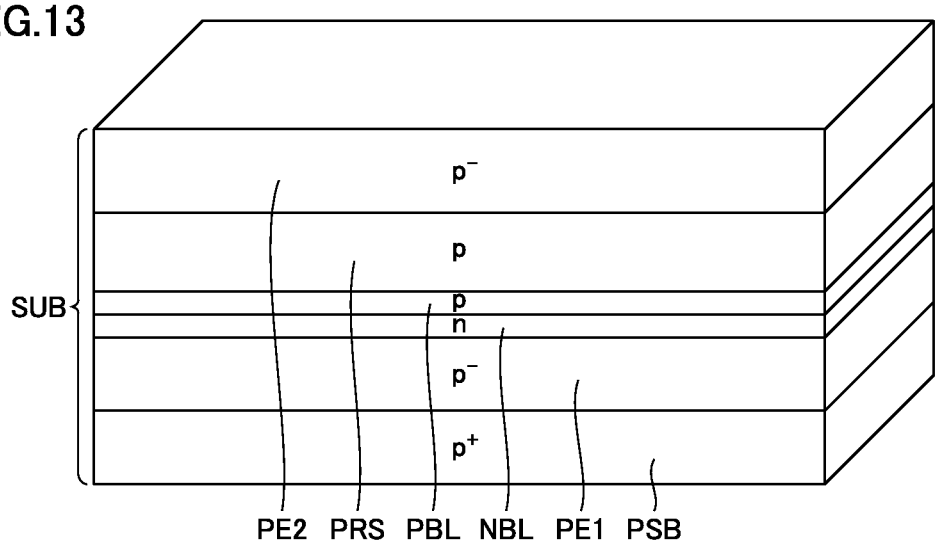

With reference to FIG. 13, normal ion injection is employed to introduce a p type impurity into p⁻ epitaxial region PE2. Thus, p type resurf region PRS having a p type impurity concentration higher than that of p⁻ epitaxial region PE2 is formed under p⁻ epitaxial region PE2. Thus, semiconductor substrate SUB having p⁺ substrate region PSB, p⁻ epitaxial region PE1, n type buried region NBL, p type buried region PBL, p type resurf region PRS, and p⁻ epitaxial region PE2 is formed.

Figure 14:
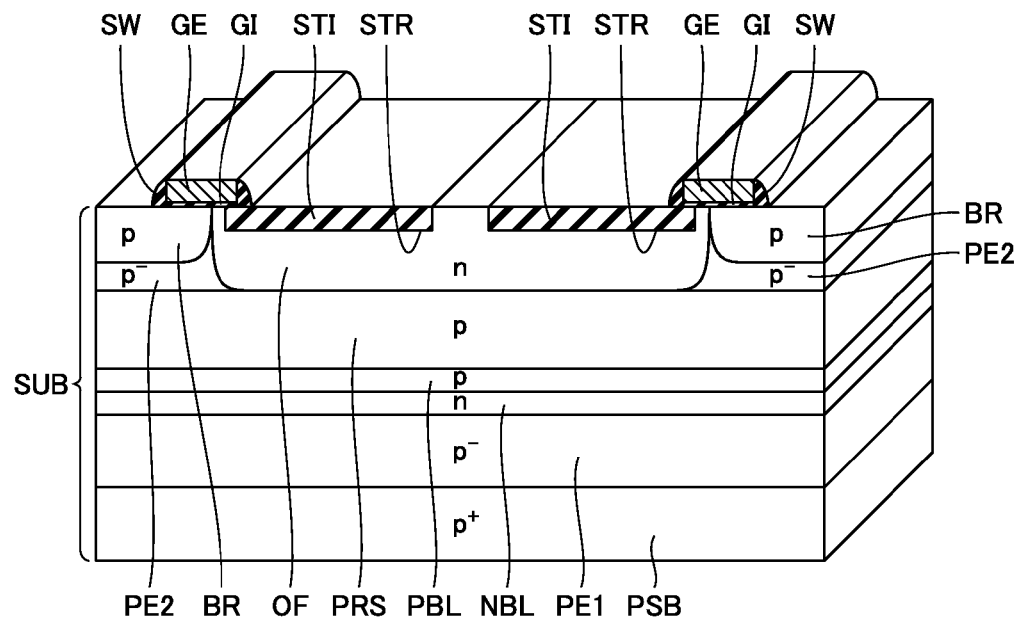

With reference to FIG. 14, n type offset region OF and p type body region BR are formed in p⁻ epitaxial region PE2 adjacently. In the main surface of semiconductor substrate SUB in n type offset region OF an STI structure is formed having trench STR and insulating layer STS buried in trench STR.

Gate electrode GE is formed on the main surface of semiconductor substrate SUB with gate insulating layer GI therebetween. Sidewall insulating layer SW is formed to cover a side wall of gate electrode GE. Note that before sidewall insulating layer SW is formed, ion injection or the like may be employed with gate electrode GE and a photoresist pattern (not shown) used as a mask to form a low-concentration impurity region configuring a lightly doped drain (LDD).

Figure 15:
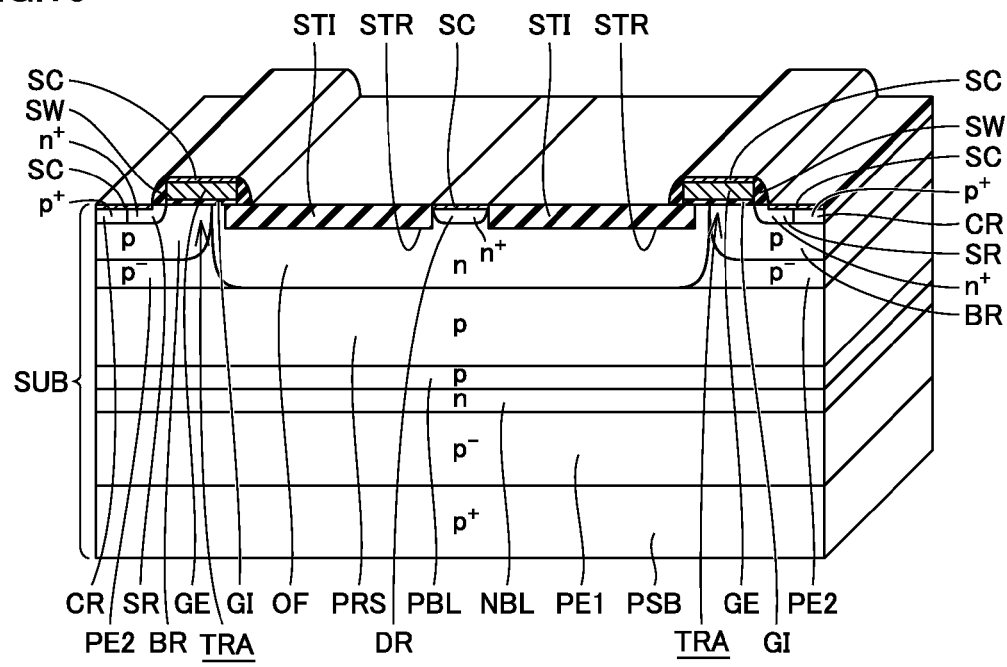

With reference to FIG. 15, a metal layer (not shown) made for example of a high melting point metal (e.g., cobalt) is deposited on the main surface of semiconductor substrate SUB. Subsequently, a heat treatment is performed to cause that metal layer to react with silicon to form a silicide layer (e.g., a cobalt silicide layer) SC. Silicide layer SC is formed on gate electrode GE, $n^+$ drain region DR, $n^+$ source region SR, and $p^+$ contact region CR. Subsequently, the metal layer that remains without reacting with silicon is removed.

Lateral MOS transistor TRA having $n^+$ source region SR, $n^+$ drain region DR, n type offset region OF, p type body region BR, $p^+$ contact region CR, gate insulating layer GI, and gate electrode GE is thus formed.

Figure 16:
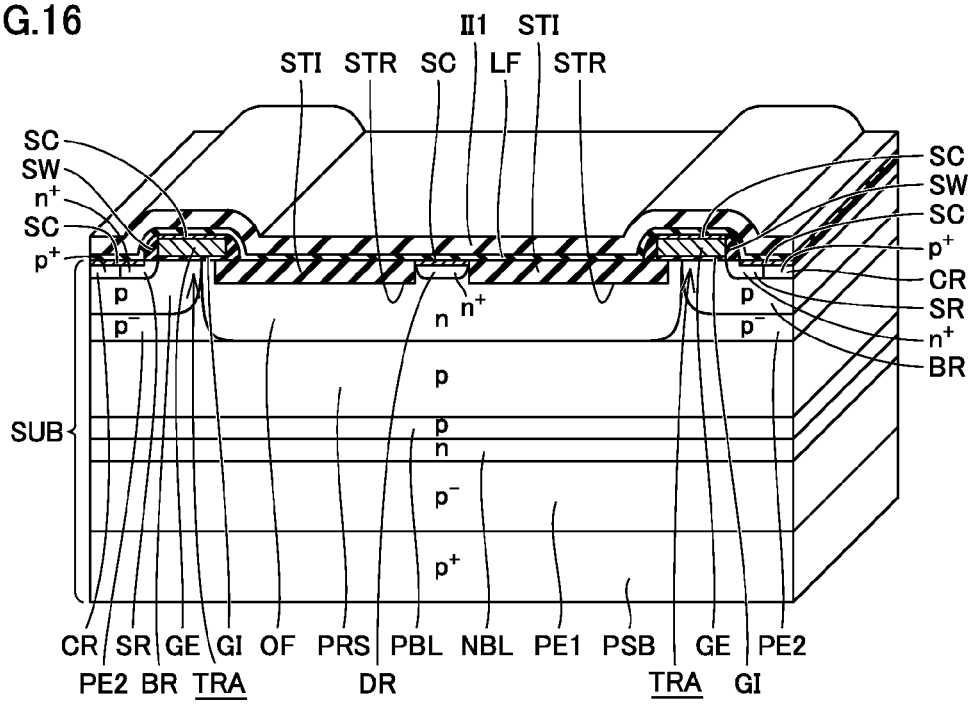

With reference to FIG. 16, liner insulating layer LF and interlayer insulating layer II1 are sequentially deposited on the main surface of semiconductor substrate SUB for example by chemical vapor deposition (CVD) to cover lateral MOS transistor TRA. Liner insulating layer LF is made for example of silicon nitride film.

Figure 17:
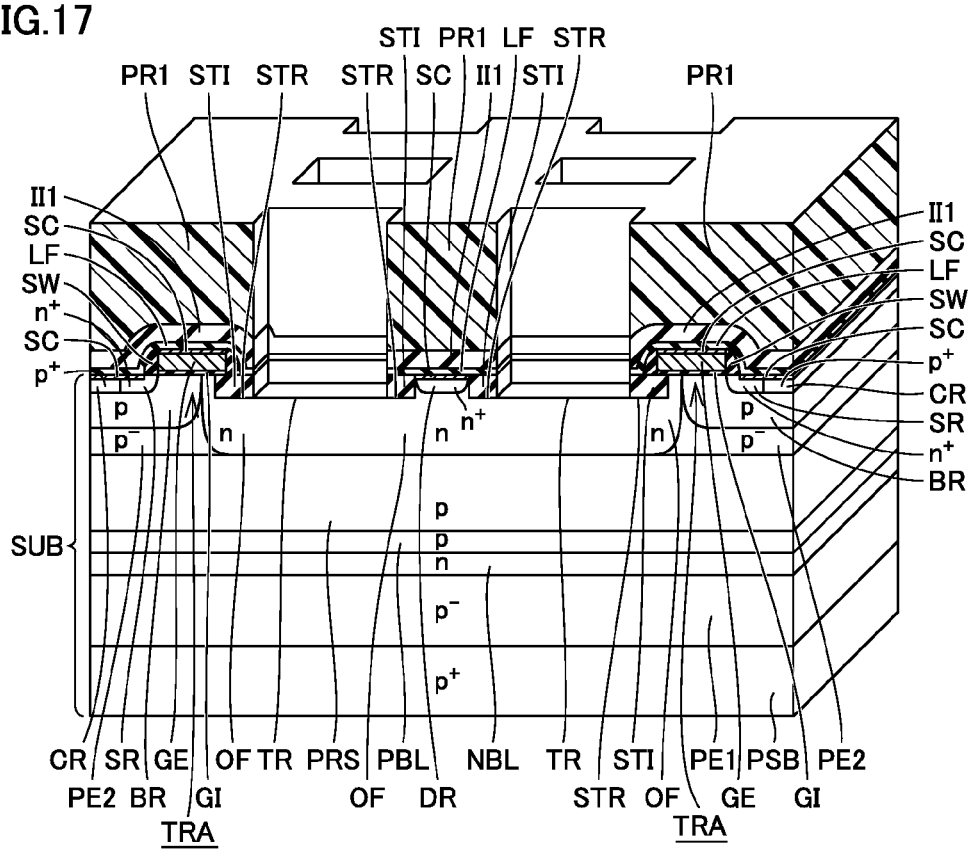

With reference to FIG. 17, a photoresist PR1 is applied to cover a top of interlayer insulating layer II1. Photoresist PR1 is patterned by normal exposure and development. Photoresist PR1 thus patterned is used as a mask to anisotropically etch interlayer insulating layer II1, liner insulating layer LF, and insulating layer STS successively. Trench TR penetrating interlayer insulating layer II1, liner insulating layer LF, and insulating layer STS is thus formed. Subsequently, photoresist PR1 is removed by ashing or the like.

Figure 18:
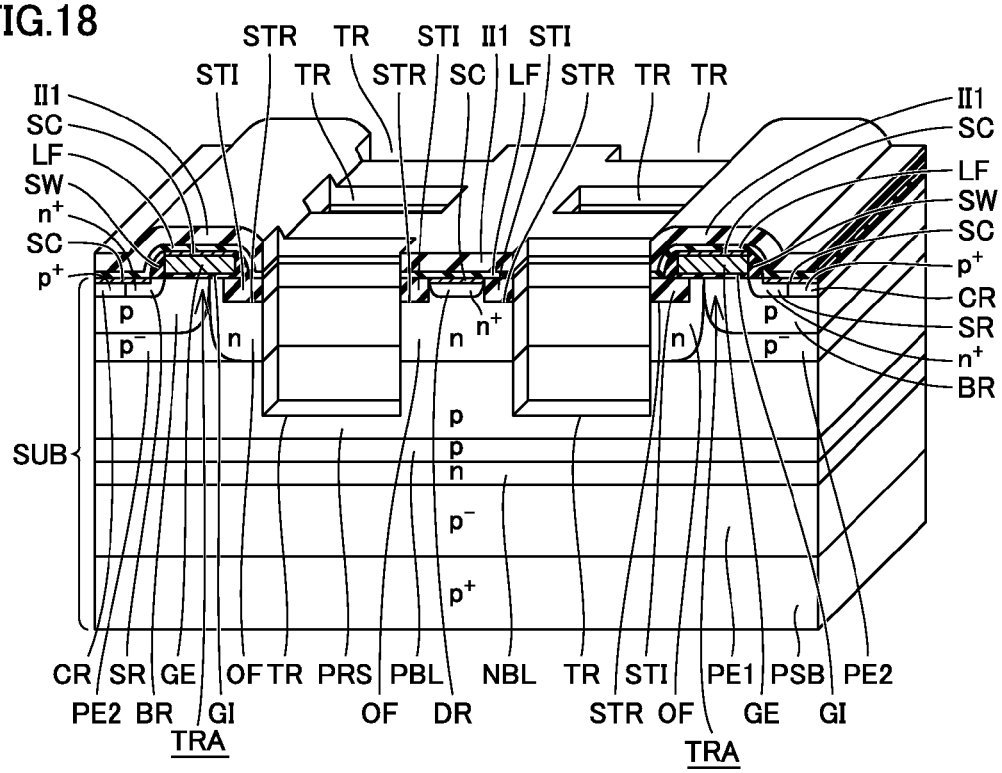

With reference to FIG. 18, Interlayer insulating layer II1 is used as a mask to anisotropically etch n type offset region OF and p type resurf region PRS. This selectively removes semiconductor substrate SUB directly under trench TR (i.e., n type offset region OF and p type resurf region PRS). Thus, a plurality of trenches TR are formed that extend from an upper surface of interlayer insulating layer II1 through interlayer insulating layer II1, liner insulating layer LF, insulating layer STS and n type offset region OF to reach p type resurf region PRS. The plurality of trenches TR are each formed in the main surface of semiconductor substrate SUB in n type offset region OF to extend in a direction from $n^+$ drain region DR toward $n^+$ source region SR.

Figure 19:
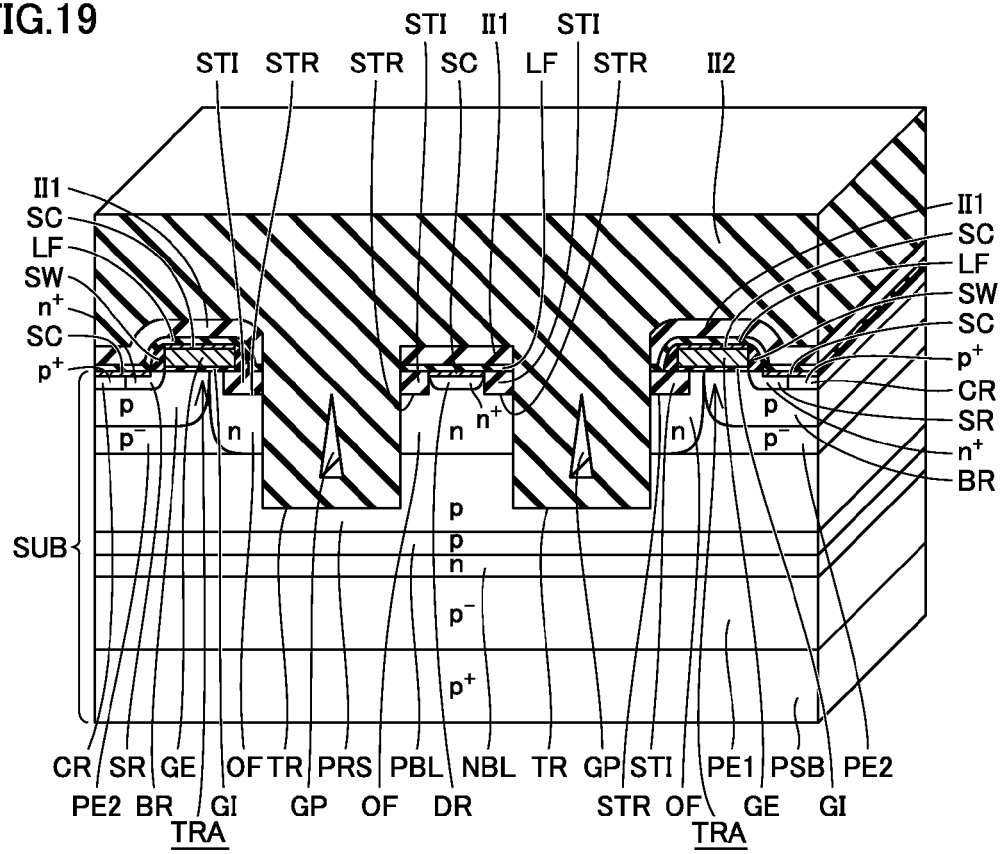

With reference to FIG. 19, interlayer insulating layer II2 is formed to cover a top of lateral MOS transistor TRA and be buried in trench TR. In doing so, trench TR has a high aspect ratio, and a closed void GP results in trench TR.

Note that interlayer insulating layers II1 and II2 are each made for example of boro phospho tetra ethyl ortho silicate (BP-TEOS) or normal silicon oxide.

Figure 20:
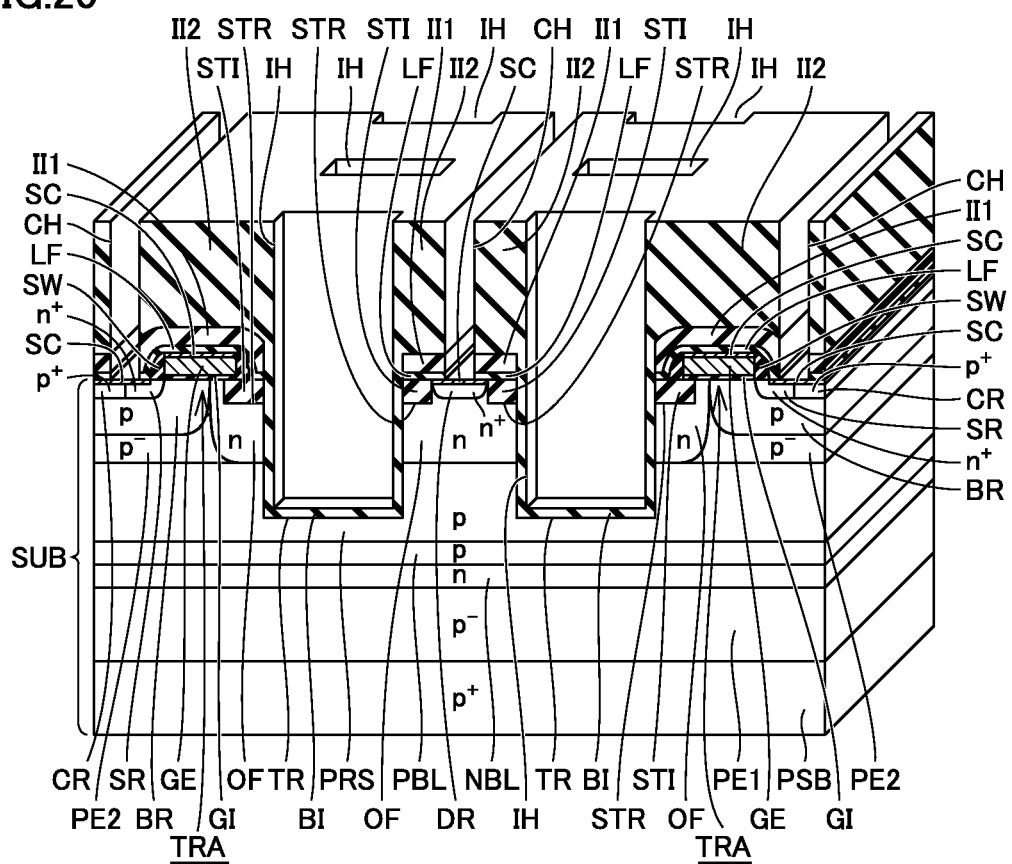

With reference to FIG. 20, normal photolithography and etching are employed to provide interlayer insulating layer II2 with hole IH. Hole IH is formed to extend from an upper surface of interlayer insulating layer II2 into trench TR while leaving interlayer insulating layer II2 on the side wall of trench TR and the bottom wall of trench TR.

Furthermore, normal photolithography and etching are employed to provide interlayer insulating layer II2 with contact hole CH. Contact hole CH is formed to reach both silicide layer SC on $n^+$ source region SR and $p^+$ contact region CR, and silicide layer SC on $n^+$ drain region DR.

With reference to FIG. 9, sputtering or CVD is employed to deposit a barrier metal (not shown) made of titanium, titanium nitride, tantalum, or tantalum nitride. Subsequently, CVD is employed to deposit a conducting layer made for example of tungsten/copper on an upper surface of interlayer insulating layer II2 to bury the conducting layer in hole IH and contact hole CH.

Subsequently, etching back or chemical mechanical polishing (CMP) is employed to remove the conducting layer on the upper surface of interlayer insulating layer II2 while leaving the conducting layer in hole IH and contact hole CH. Thus, conducting layer BC buried in hole IH and conducting layer CL buried in contact hole CH are formed. Subsequently, interconnect layer IL is formed on an upper surface of interlayer insulating layer II2, and the semiconductor device of the present embodiment is thus produced.

The present embodiment provides a semiconductor device including a trench resurf structure having trench TR with conducting layer BC therein, and, as well as the first embodiment, allows reduced on resistance and enhanced breakdown voltage to be both established at a high level.

Furthermore, the present embodiment provides a method for manufacturing a semiconductor device, that allows interlayer insulating layer II2 to be formed and an insulating layer to be also buried in trench TR to serve as surrounding insulating layer BI, as shown in FIG. 19. Furthermore, as shown in FIG. 20, hole IH and contact hole CH can also be formed simultaneously.

Furthermore, a trench portion configured of a plurality of trenches TR each formed to extend from the main surface of semiconductor substrate SUB deeply, as shown in FIGS. 9 and 10, increases the resurf effect. However, trench TR shallower than n type offset region OF and thus having a bottom wall located within n type offset region OF, as shown in FIGS. 21 and 22, also allows the resurf effect to be presented.

Figure 21:
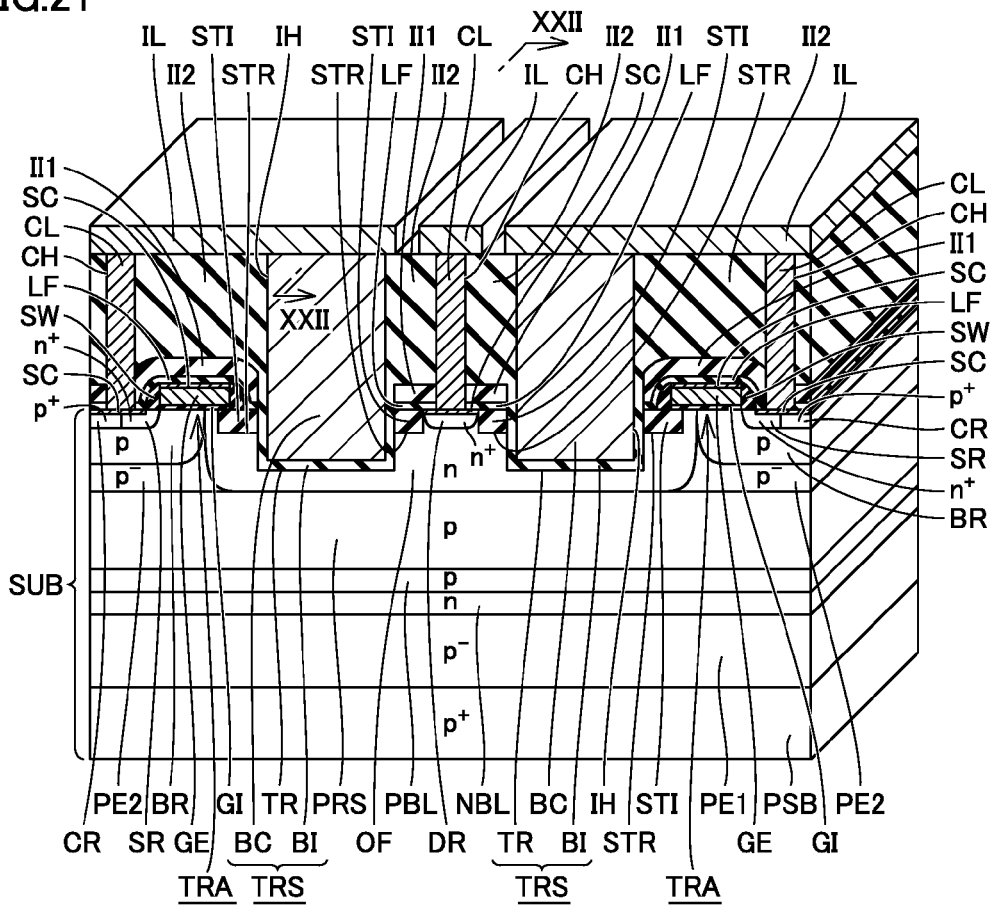
FIG. 21 is a schematic perspective view of the semiconductor device of the second embodiment in another configuration having a trench resurf structure with a trench portion having a bottom wall in an offset region.
Figure 22:
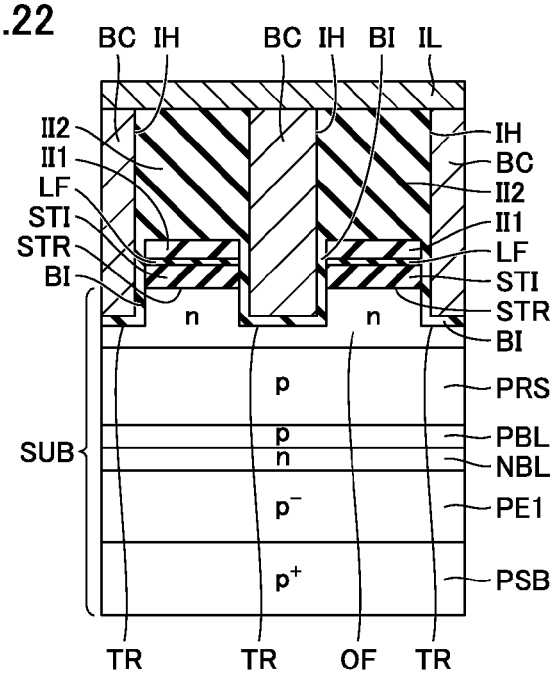
FIG. 22 is a schematic cross section taken along a line XXII-XXII shown in FIG. 21.

Note that the FIGS. 21 and 22 configuration other than the above is substantially the same as that shown in FIGS. 9 and 10, and accordingly, identical components are identically denoted and will not be described repeatedly.

Figure 23:
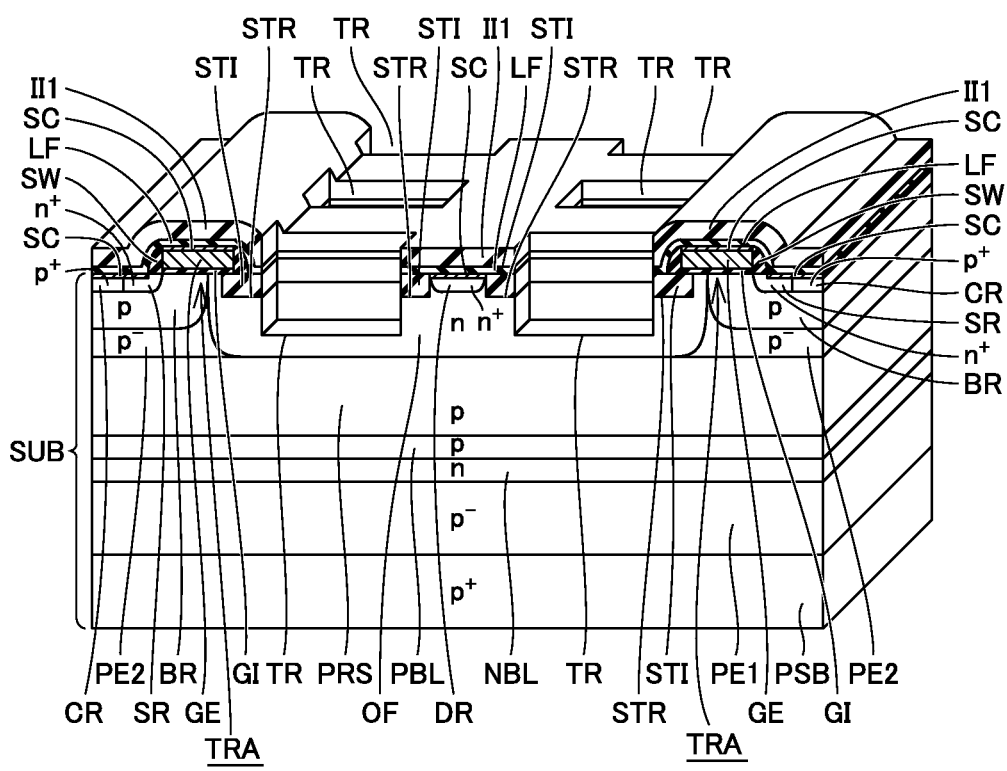
FIG. 23 is a schematic perspective view showing a method for manufacturing the semiconductor device of the second embodiment in the other configuration.

The FIGS. 21 and 22 configuration can be produced via controlling an etching to form trench TR so that trench TR is not deeper than n type offset region OF, as shown in FIG. 23. The remaining manufacturing steps are similar to those in the method of manufacturing the configuration shown in FIGS. 9 and 10, and accordingly, will not be described repeatedly.

The FIGS. 21 and 22 configuration, as well as the FIGS. 9 and 10 configuration, allows reduced on resistance and enhanced breakdown voltage to be both established at a high level.

Third Embodiment

Figure 24:
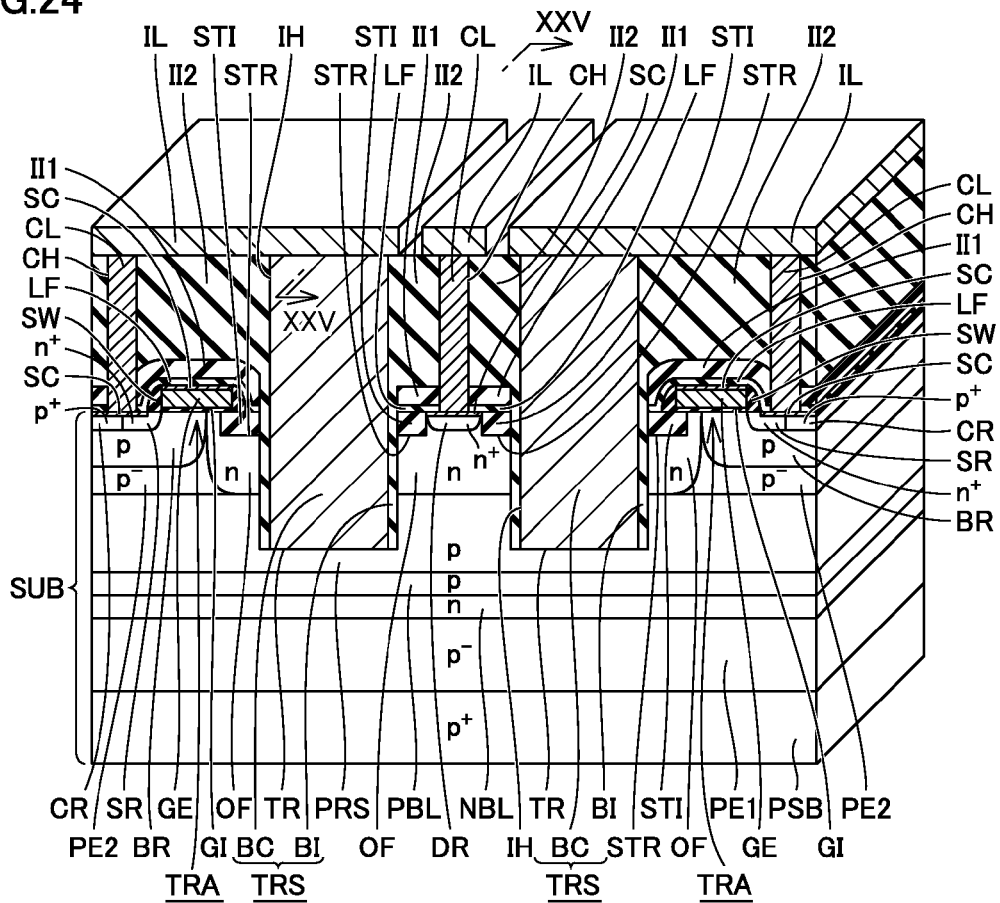
FIG. 24 is a schematic perspective view of a configuration of a semiconductor device in a third embodiment.
Figure 25:
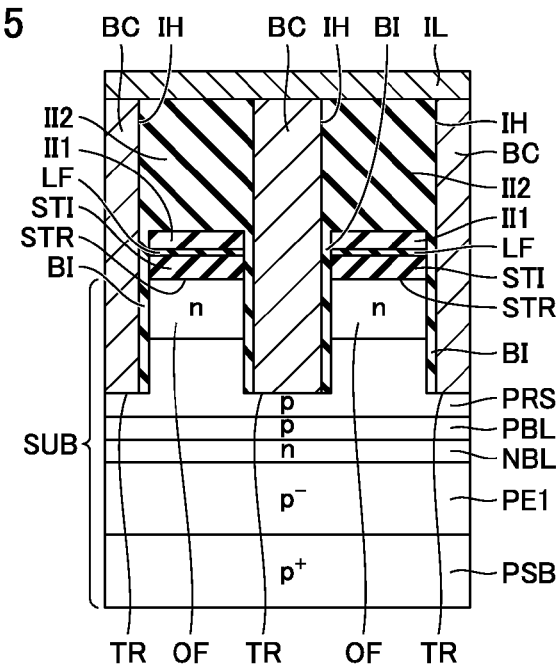
FIG. 25 is a schematic cross section taken along a line XXV-XXV shown in FIG. 24.

With reference to FIG. 24 and FIG. 25, the present embodiment provides a configuration different from the FIGS. 9 and 10 configuration in that the former provides conducting layer BC having a bottom surface in contact with p type resurf region PRS. While surrounding insulating layer BI covers a side surface of conducting layer BC, surrounding insulating layer BI does not cover the bottom surface of conducting layer BC. Accordingly, conducting layer BC has the bottom surface in contact with p type resurf region PRS, and conducting layer BC is thus electrically connected to p type resurf region PRS. As conducting layer BC is electrically connected to $n^+$ source region SR, p type resurf region PRS is also electrically connected to $n^+$ source region SR and thus has a source potential.

Note that the configuration of the present embodiment other than the above is substantially the same as that shown in FIGS. 9 and 10, and accordingly, identical components are identically denoted and will not be described repeatedly.

Figure 26:
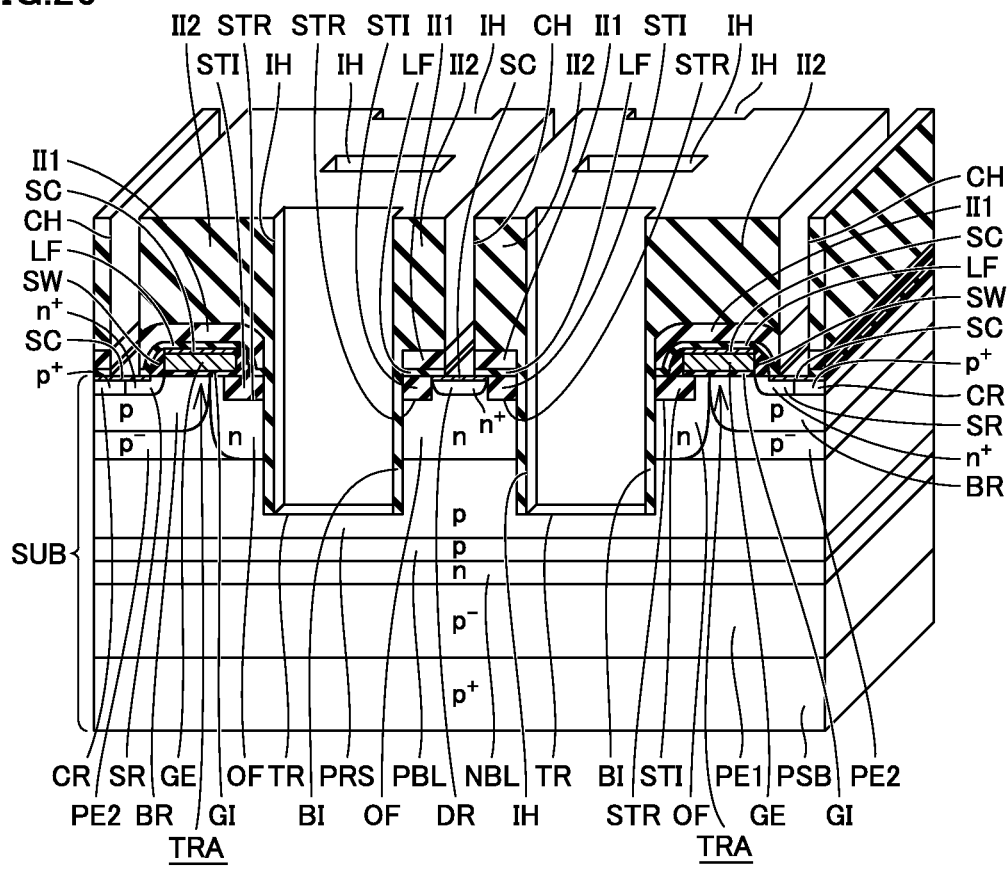
FIG. 26 is a schematic perspective view showing a method for manufacturing the semiconductor device of the third embodiment.

The FIGS. 24 and 25 configuration can be produced via controlling an etching to allow hole IH to extend through interlayer insulating layer II2 and penetrate the bottom of trench TR to reach p type resurf region PRS, as shown in FIG. 26. The remaining manufacturing steps are similar to those in the method of manufacturing the configuration shown in FIGS. 9 and 10, and accordingly, will not be described repeatedly.

The present embodiment provides a semiconductor device including trench resurf structure TRS having trench TR with conducting layer BC therein, as shown in FIGS. 24 and 25, and, as well as the first embodiment, allows reduced on resistance and enhanced breakdown voltage to be both established at a high level.

Figure 27:
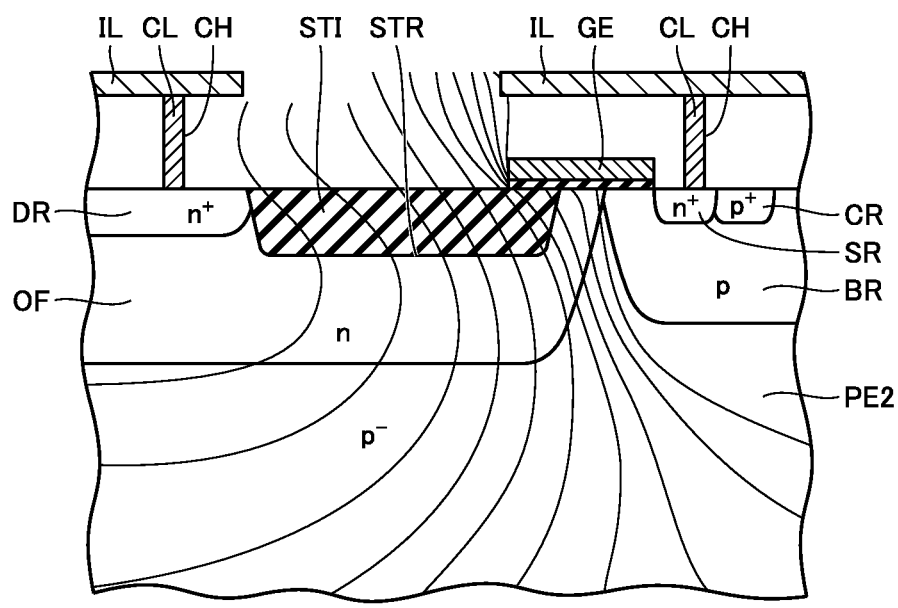
FIG. 27 is a cross section representing a potential distribution presented when there is no resurf region under an offset region.

Should p type resurf region PRS be absent, then, as shown in FIG. 27, when n type offset region OF is depleted, an electric field near the junction of n type offset region OF and p type body region BR concentrates. The electric field concentration results in reduced breakdown voltage.

Figure 28:
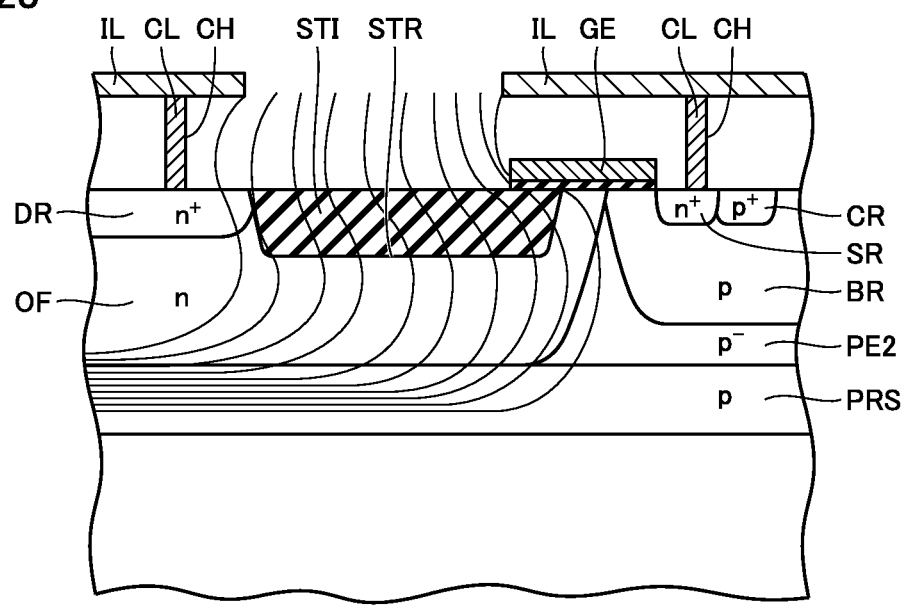
FIG. 28 is a cross section representing a potential distribution presented when there is a resurf region under an offset region.

In contrast, the present embodiment provides p type resurf region PRS electrically connected to conducting layer BC, as shown in FIG. 24 and FIG. 25, and thus fixed to a source potential. This uniformly spaces isoelectric lines passing through a depletion layer provided when n type offset region OF is depleted, as shown in FIG. 28. This can alleviate the electric field concentration near the junction of n type offset region OF and p type body region BR and thus allows reduced on resistance and enhanced breakdown voltage to be both established at a further higher level.

Fourth Embodiment

Figure 29:
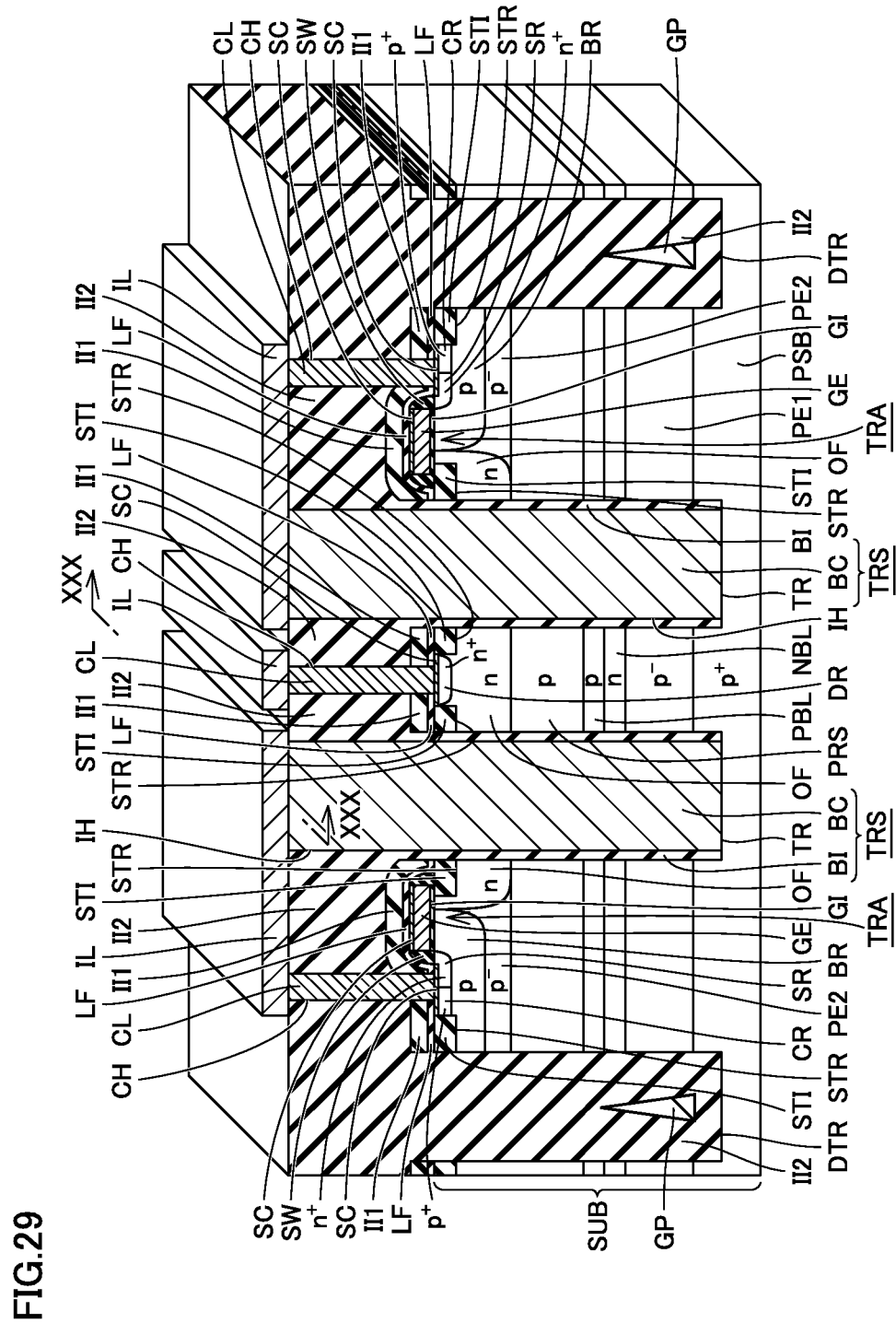
FIG. 29 is a schematic perspective view of a configuration of a semiconductor device in a fourth embodiment.
Figure 30:
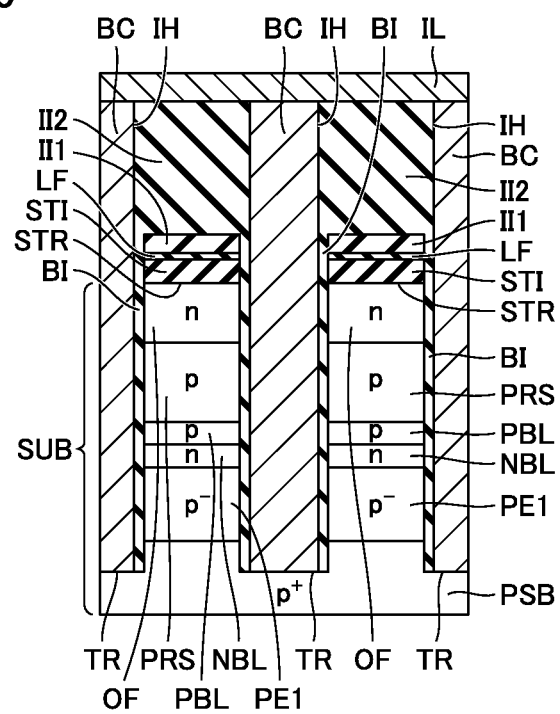
FIG. 30 is a schematic cross section taken along a line XXX-XXX shown in FIG. 29.

With reference to FIG. 29 and FIG. 30, the present embodiment provides a configuration different from the FIGS. 9 and 10 configuration in that the former has trench TR with conducting layer BC therein in contact with $p^+$ substrate region PSB or $p^-$ epitaxial region PE1.

Trench TR penetrates a device isolating impurity region, or n type buried region NBL and p type buried region PBL, and thus reaches $p^+$ substrate region PSB or $p^-$ epitaxial region PE1 located under n type buried region NBL. In particular, for lateral MOS transistor TRA formed in $p^-$ epitaxial region PE2, n type buried region NBL of a conduction type opposite to that of $p^-$ epitaxial region PE2 has a substantial role of electrically isolating lateral MOS transistor TRA from other devices.

Conducting layer BC has a bottom surface in contact with $p^+$ substrate region PSB or $p^-$ epitaxial region PE1 at the bottom of trench TR. While surrounding insulating layer BI covers a side surface of conducting layer BC, surrounding insulating layer BI does not cover the bottom surface of conducting layer BC. Accordingly, conducting layer BC has the bottom surface in contact with $p^+$ substrate region PSB or $p^-$ epitaxial region PE1, and conducting layer BC is thus electrically connected to $p^+$ substrate region PSB or $p^-$ epitaxial region PE1. As conducting layer BC is electrically connected to $n^+$ source region SR, $p^+$ substrate region PSB or $p^-$ epitaxial region PE1 is also electrically connected to $n^+$ source region SR and thus has a source potential.

Furthermore, as seen in a plan view, semiconductor substrate SUB has a deep trench DTR formed therein to surround lateral MOS transistor TRA. Deep trench DTR penetrates n type buried region NBL and p type buried region PBL and thus reaches $p^+$ substrate region PSB or $p^-$ epitaxial region PE1 located under n type buried region NBL.

Deep trench DTR has interlayer insulating layer II2 introduced therein. Interlayer insulating layer II2 has a closed void GP in deep trench DTR. Lateral MOS transistor TRA has a side portion surrounded by deep trench DTR having interlayer insulating layer II2 introduced therein and has a lower portion covered with n type buried region NBL, and lateral MOS transistor TRA is thus electrically isolated from other devices.

Note that the configuration of the present embodiment other than the above is substantially the same as that shown in FIGS. 9 and 10, and accordingly, identical components are identically denoted and will not be described repeatedly.

Figure 31:
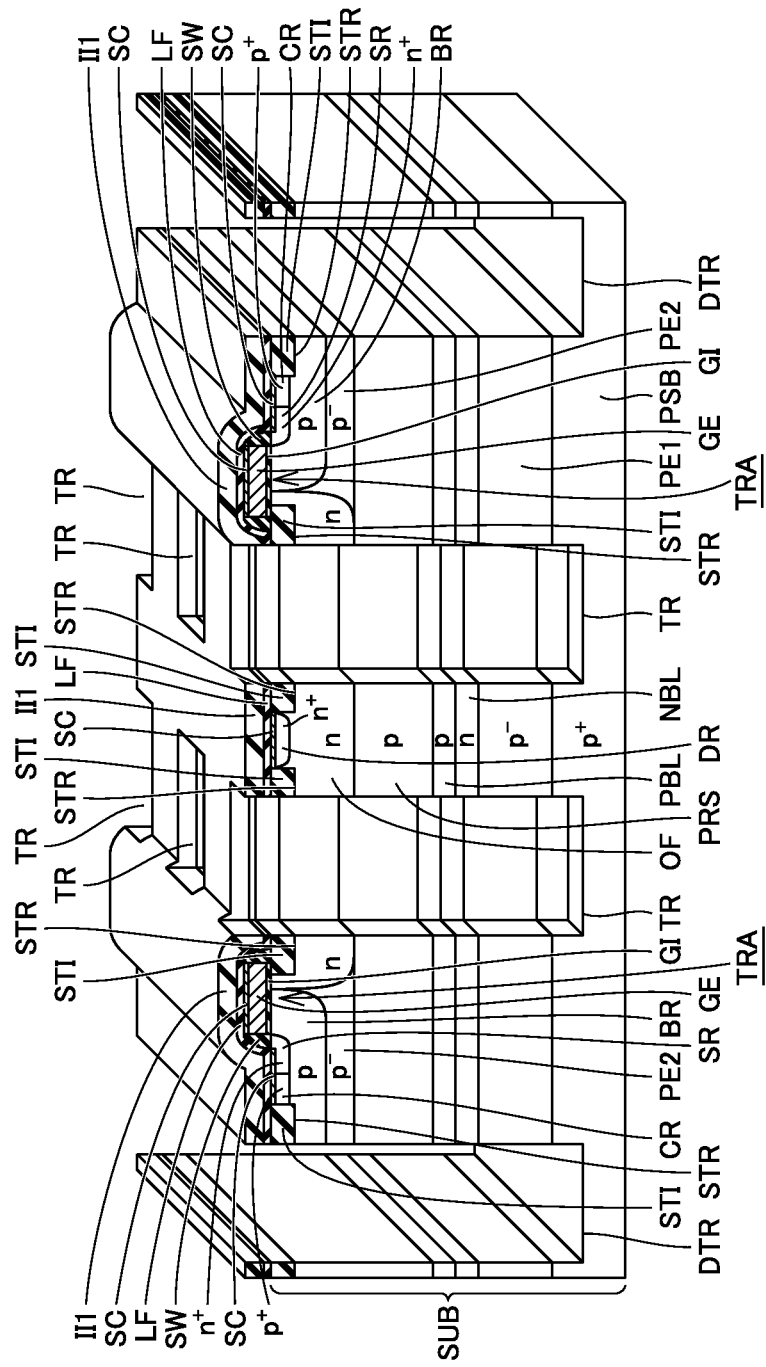
FIGS. 31 and 32 are schematic perspective views showing first and second steps, respectively, of a method for manufacturing the semiconductor device of the fourth embodiment.
Figure 32:
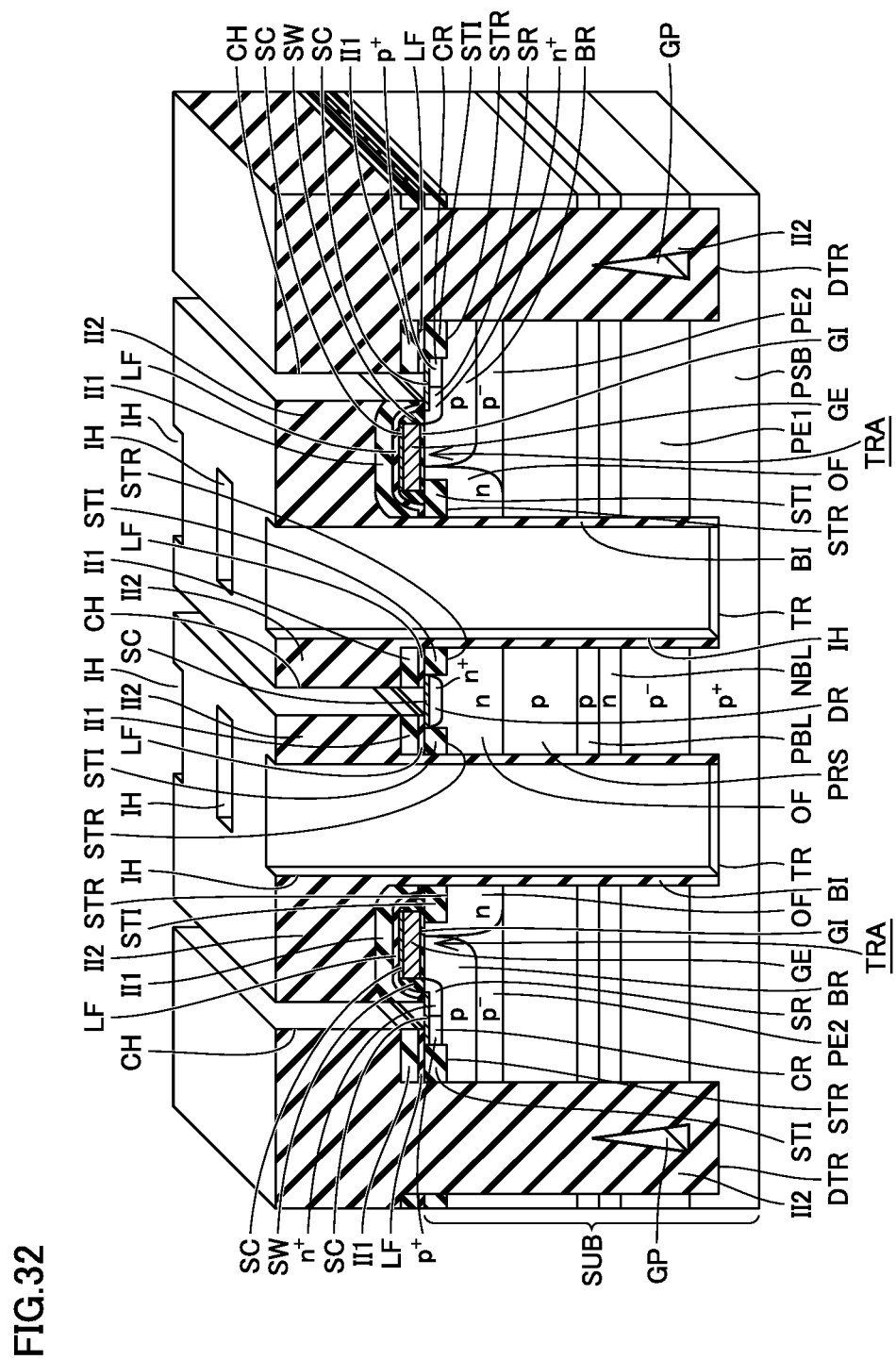

The configuration of the present embodiment can be produced as follows: deep trench DTR is formed through the same process as trench TR is formed, as shown in FIG. 31, and after interlayer insulating layer II2 is introduced into both trench TR and deep trench DTR, hole IH is formed to reach the bottom wall of trench TR, as shown in FIG. 32. Note that, when interlayer insulating layer II2 is buried in trench TR and deep trench DTR, with trench TR and deep trench DTR each having a high aspect ratio, closed void GP results in trench TR and deep trench DTR.

The remaining manufacturing steps are similar to those in the method of manufacturing the configuration shown in FIGS. 9 and 10, and accordingly, will not be described repeatedly.

The present embodiment provides a semiconductor device including a trench resurf structure having trench TR with conducting layer BC therein, and, as well as the first embodiment, allows reduced on resistance and enhanced breakdown voltage to be both established at a high level.

Furthermore, conducting layer BC that is in contact with $p^+$ substrate region PSB or $p^-$ epitaxial region PE1 allows $p^+$ substrate region PSB or $p^-$ epitaxial region PE1 to be fixed to a source potential.

Figure 33:
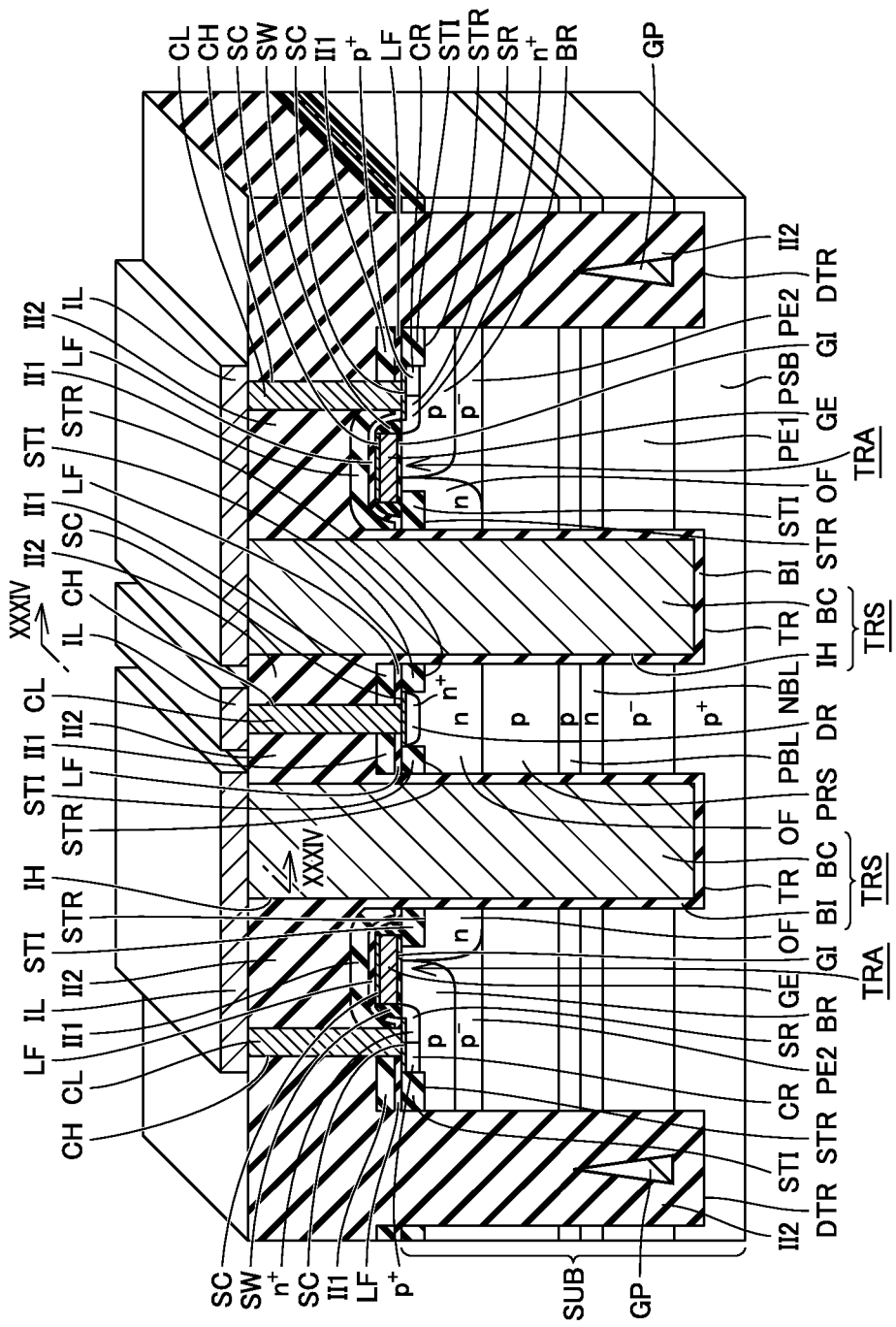
FIG. 33 is a schematic perspective view of the semiconductor device of the fourth embodiment in another configuration.
Figure 34:
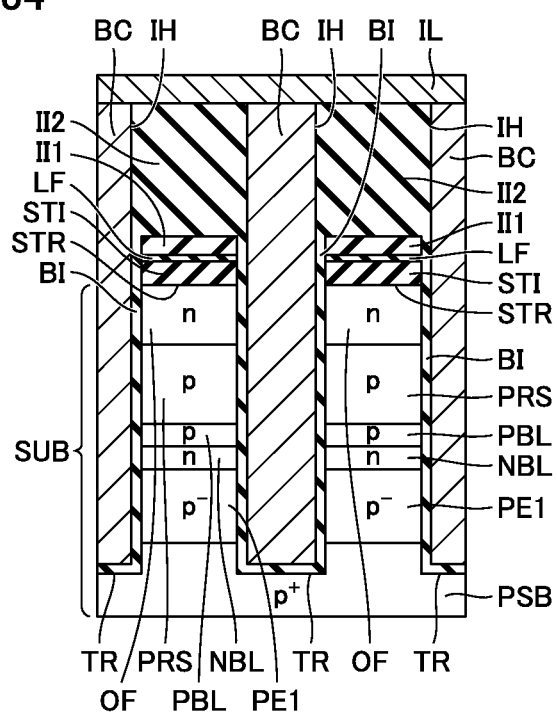
FIG. 34 is a schematic cross section taken along a line XXXIV-XXXIV shown in FIG. 33.

Note that, as shown in FIG. 33 and FIG. 34, a configuration having trench TR reaching $p^+$ substrate region PSB or $p^-$ epitaxial region PE1 may have conducting layer BC having a bottom surface provided with surrounding insulating layer BI and thus out of contact with $p^+$ substrate region PSB or $p^-$ epitaxial region PE1. This configuration cannot fix $p^+$ substrate region PSB or $p^-$ epitaxial region PE1 in potential by conducting layer BC. However, the trench resurf structure has trench TR with conducting layer BC therein, and the present embodiment, as well as the first embodiment, allows reduced on resistance and enhanced breakdown voltage to be both established at a high level.

Figure 35:
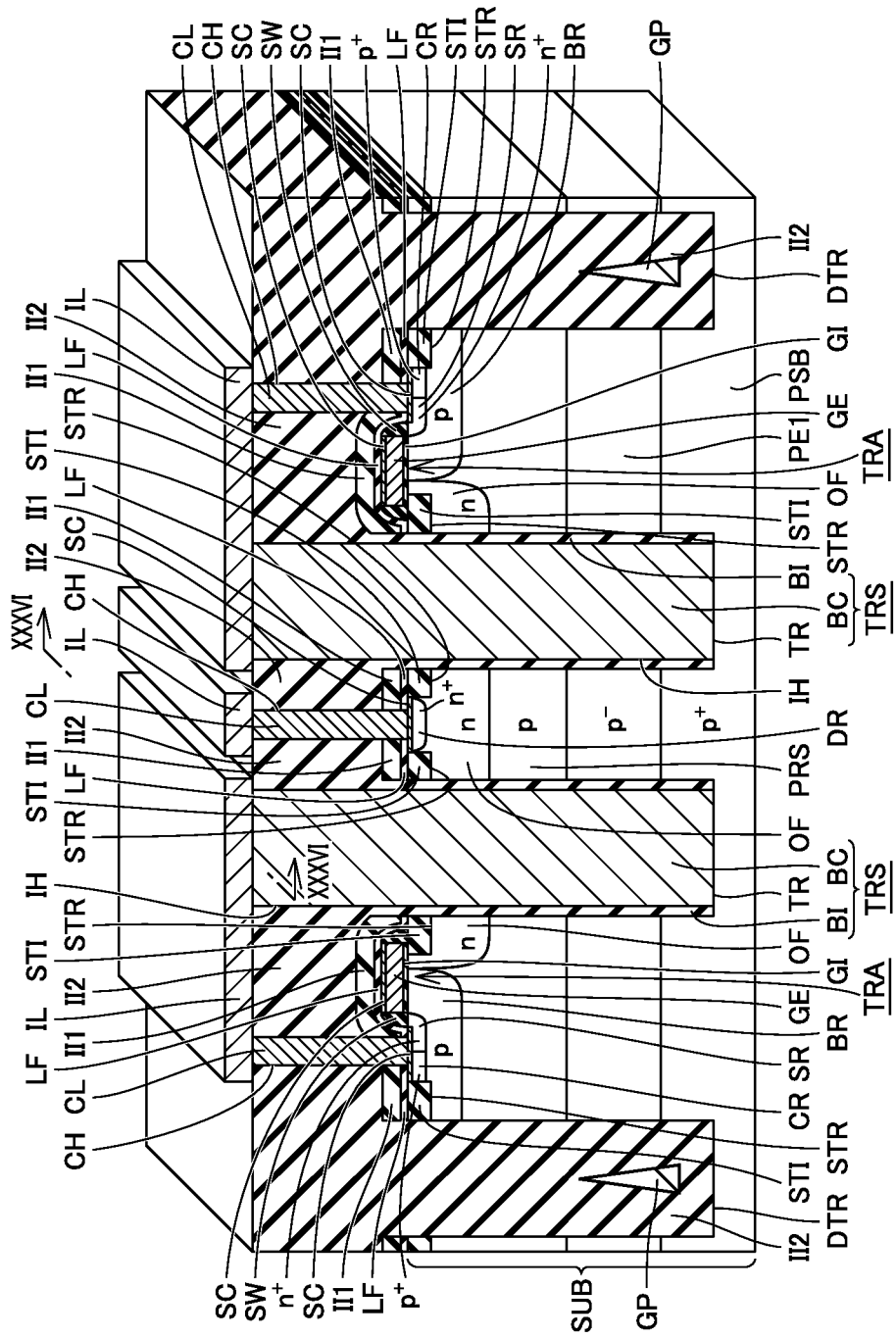
FIG. 35 is a schematic perspective view of the semiconductor device of the fourth embodiment in still another configuration.
Figure 36:
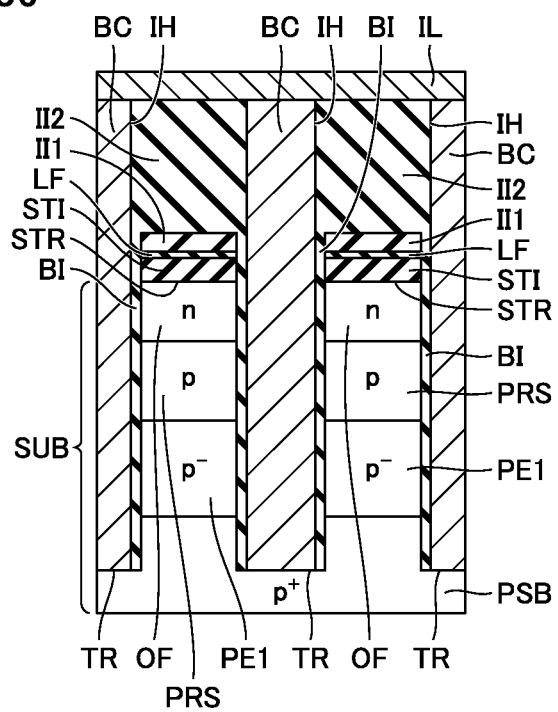
FIG. 36 is a schematic cross section taken along a line XXXVI-XXXVI shown in FIG. 35.

Furthermore, $p^-$ epitaxial region PE1, p type buried region PBL, and p type resurf region PRS shown in FIG. 29 and FIG. 30 may be dispensed with. In that case, as shown in FIG. 35 and FIG. 36, n type buried region NBL and $p^-$ epitaxial region PE2 will be sequentially formed on $p^+$ substrate region PSB. In this configuration, trench TR penetrates the STI structure, n type offset region OF, $p^-$ epitaxial region PE2 and n type buried region NBL and reaches $p^+$ substrate region PSB. Trench TR has conducting layer BC therein with a bottom surface in contact with $p^+$ substrate region PSB.

Note that the FIGS. 35 and 36 configuration other than the above is substantially the same as that shown in FIGS. 29 and 30, and, accordingly, identical components are identically denoted and will not be described repeatedly.

Figure 37:
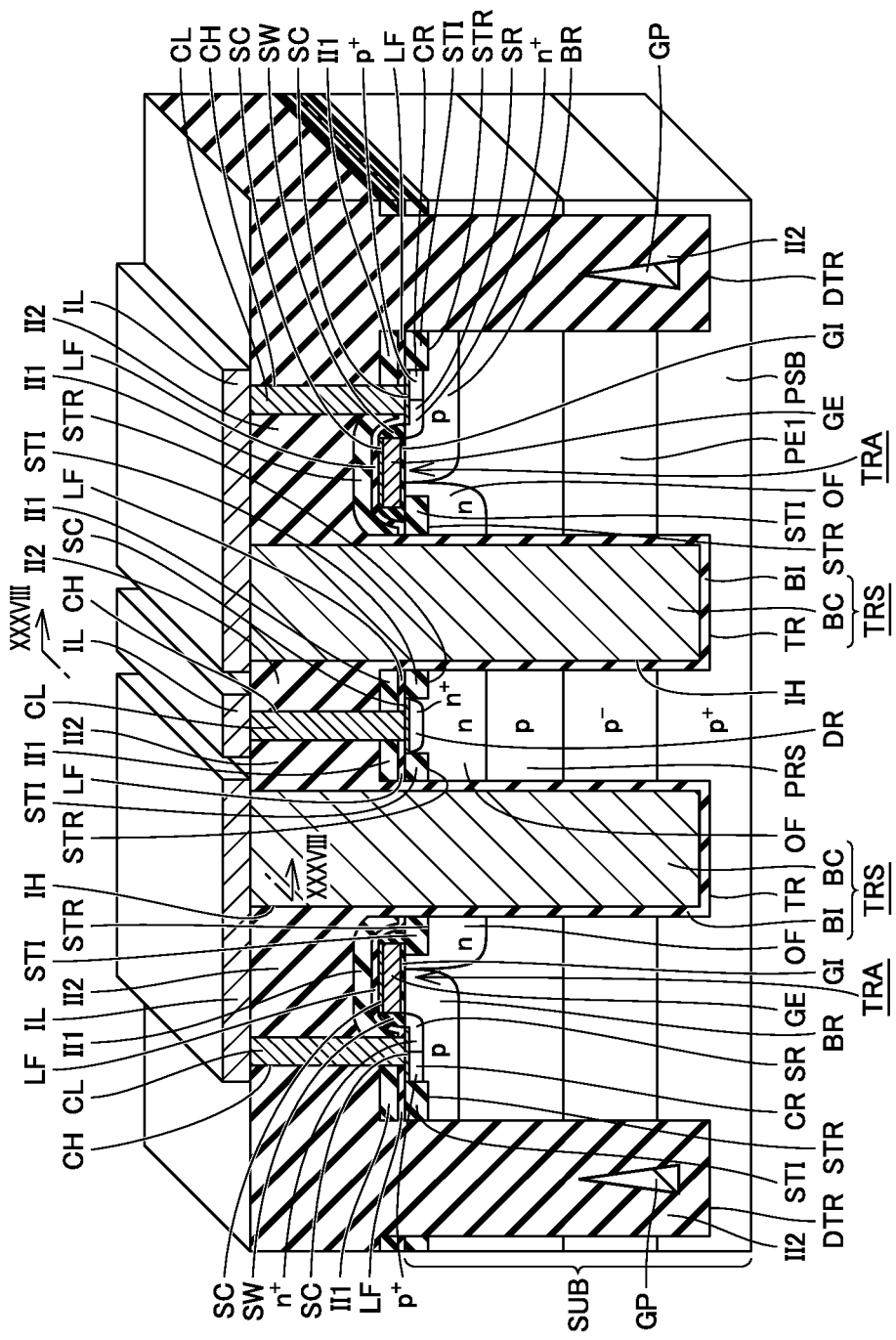
FIG. 37 is a schematic perspective view of the semiconductor device of the fourth embodiment in still another configuration.
Figure 38:
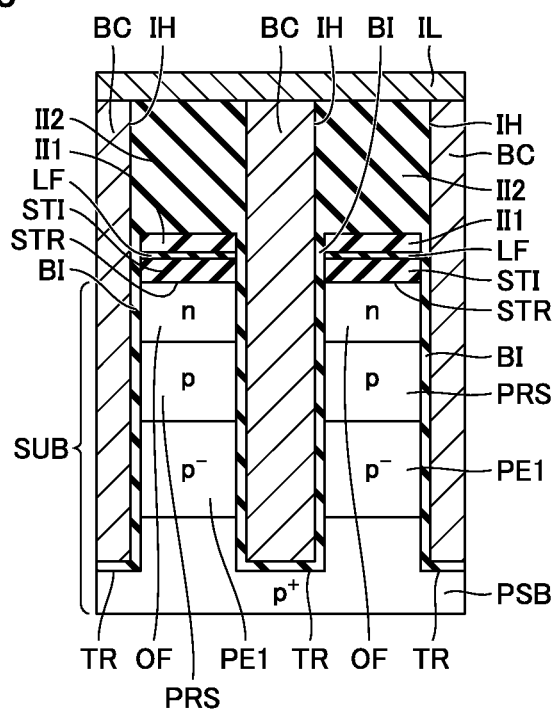
FIG. 38 is a schematic cross section taken along a line XXXVIII-XXXVIII shown in FIG. 37.

This configuration can be as effective as the FIGS. 29 and 30 configuration. Furthermore, as shown in FIG. 37 and FIG. 38, a configuration having trench TR reaching $p^+$ substrate region PSB may have conducting layer BC having a bottom surface provided with surrounding insulating layer BI and thus out of contact with $p^+$ substrate region PSB. This configuration cannot fix $p^+$ substrate region PSB in potential by conducting layer BC. However, the trench resurf structure has trench TR with conducting layer BC therein, and the present embodiment, as well as the first embodiment, allows reduced on resistance and enhanced breakdown voltage to be both established at a high level.

Figure 58:
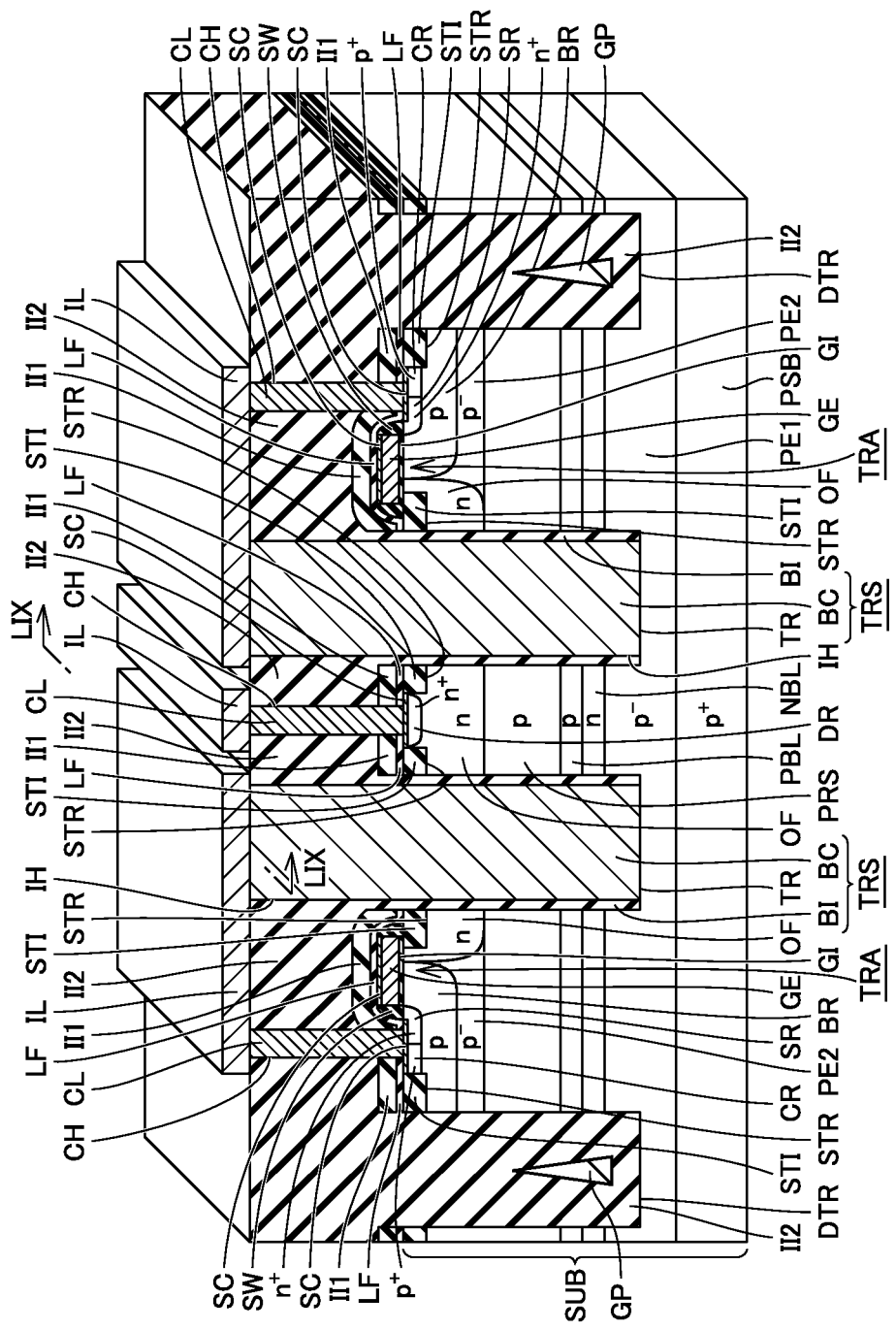
FIG. 58 is a schematic perspective view of the semiconductor device of the fourth embodiment with a conducting layer in contact with a p$^-$ epitaxial region PE1.
Figure 59:
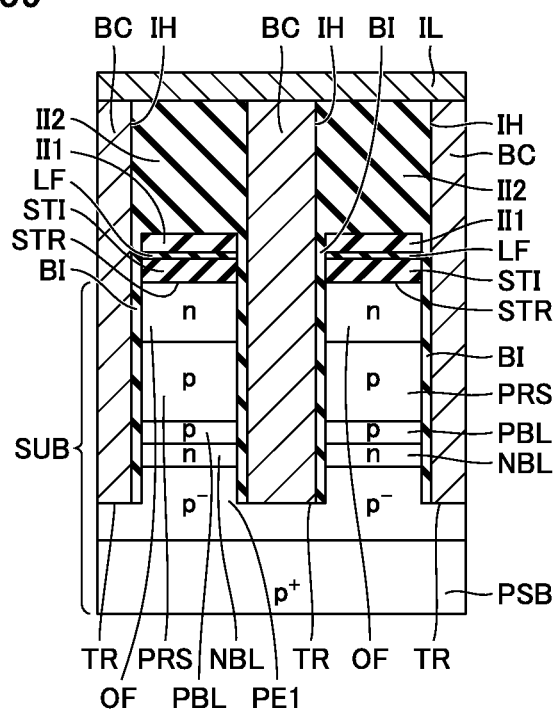
FIG. 59 is a schematic cross section taken along a line LIX-LIX shown in FIG. 58.

Furthermore, while the FIG. 29 and FIG. 30 configuration has trench TR having conducting layer BC therein with a bottom surface in contact with $p^+$ substrate region PSB, trench TR may alternatively have conducting layer BC therein with a bottom surface in contact with $p^-$ epitaxial region PE1, as shown in FIG. 58 and FIG. 59. This provides trench TR shallower than the FIG. 28 and FIG. 29 configuration and is thus advantageous in terms of cost. Furthermore, the FIG. 58 and FIG. 59 configuration can be produced via forming trench TR, as shown in FIG. 31, to form trench TR and deep trench DTR to be shallow to reach $p^-$ epitaxial region PE1.

Fifth Embodiment

Figure 39:
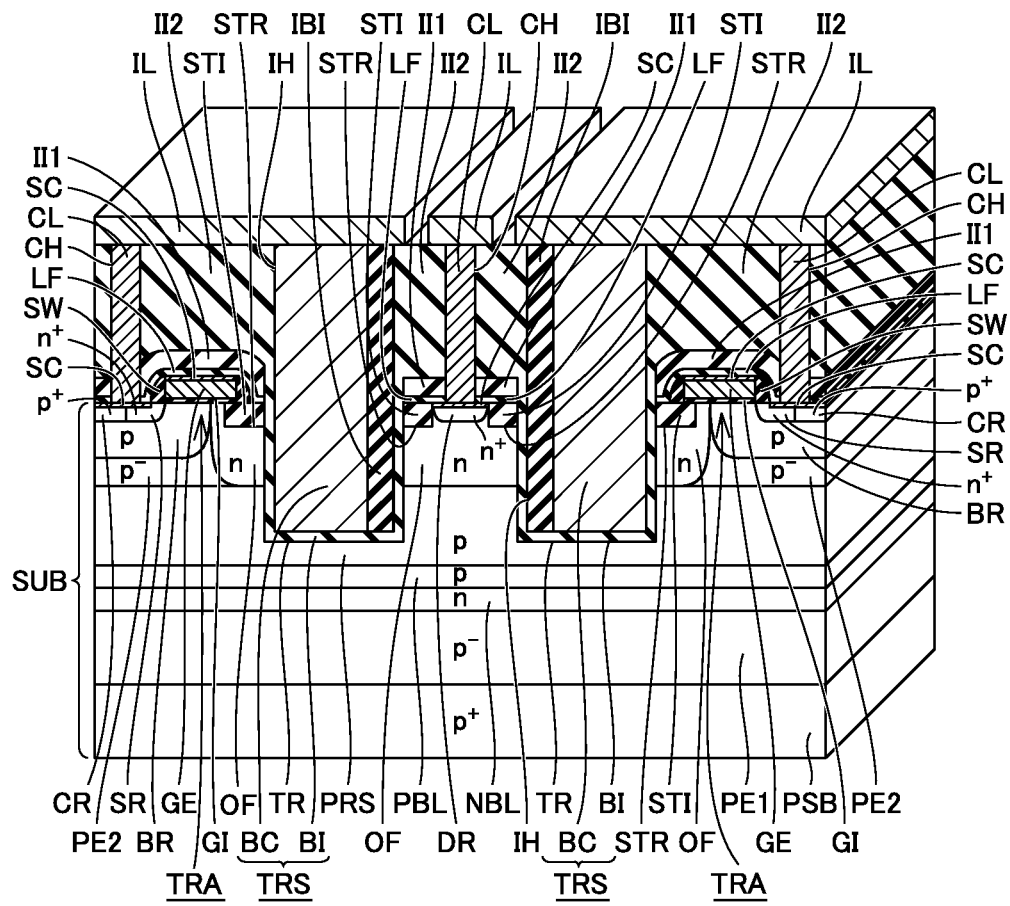
FIG. 39 is a schematic perspective view of a configuration of a semiconductor device in a fifth embodiment.
Figure 40:
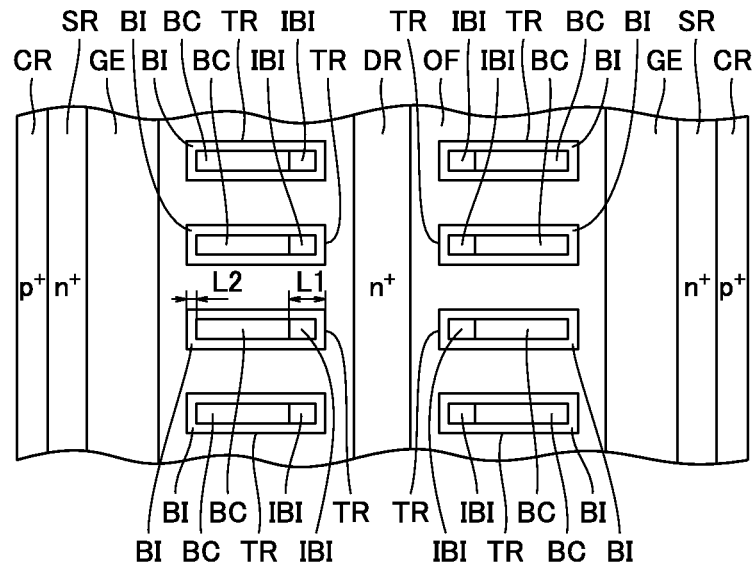
FIG. 40 is a plan view of the configuration of the semiconductor device shown in FIG. 39.

With reference to FIG. 39 and FIG. 40, the present embodiment provides a configuration different from the FIGS. 9 and 10 configuration in that the former provides a buried insulating layer IBI buried in trench TR at that side of conducting layer BC which is closer to the drain. In this configuration, with reference to FIG. 40, as seen on the main surface of semiconductor substrate SUB, there are a distance L1 between an end of conducting layer BC closer to $n^+$ drain region DR and an end of trench TR closer to $n^+$ drain region DR and a distance L2 between an end of conducting layer BC closer to $n^+$ source region SR and an end of trench TR closer to $n^+$ source region SR, distance L1 being larger than distance L2.

Buried insulating layer IBI is made for example of silicon oxide, silicon nitride or the like. Buried insulating layer IBI may be identical to or different from surrounding insulating layer BI in material.

Note that the configuration of the present embodiment other than the above is substantially the same as that shown in FIGS. 9 and 10, and accordingly, identical components are identically denoted and will not be described repeatedly.

The present embodiment provides a semiconductor device including a trench resurf structure having trench TR with conducting layer BC therein, and, as well as the first embodiment, allows reduced on resistance and enhanced breakdown voltage to be both established at a high level.

Furthermore, the resurf trench structure has conducting layer BC fixed to a source potential. Accordingly, when conducting layer BC approaches $n^+$ drain region DR, a difference in potential arises between the short distance of conducting layer BC and $n^+$ drain region DR by the voltage applied to the drain. This may cause electric field concentration at an edge of trench TR or the like, resulting in reduced breakdown voltage, impaired device reliability and other negative effects.

The present embodiment provides buried insulating layer IBI buried in trench TR at that side of conducting layer BC which is closer to the drain. This ensures large distance L1 between the end of conducting layer BC closer to $n^+$ drain region DR and the end of trench TR closer to $n^+$ drain region DR. This can reduce/prevent electric field concentration attributed to an otherwise shorter distance between conducting layer BC and $n^+$ drain region DR and thus prevent reduced breakdown voltage.

Sixth Embodiment

Figure 41:
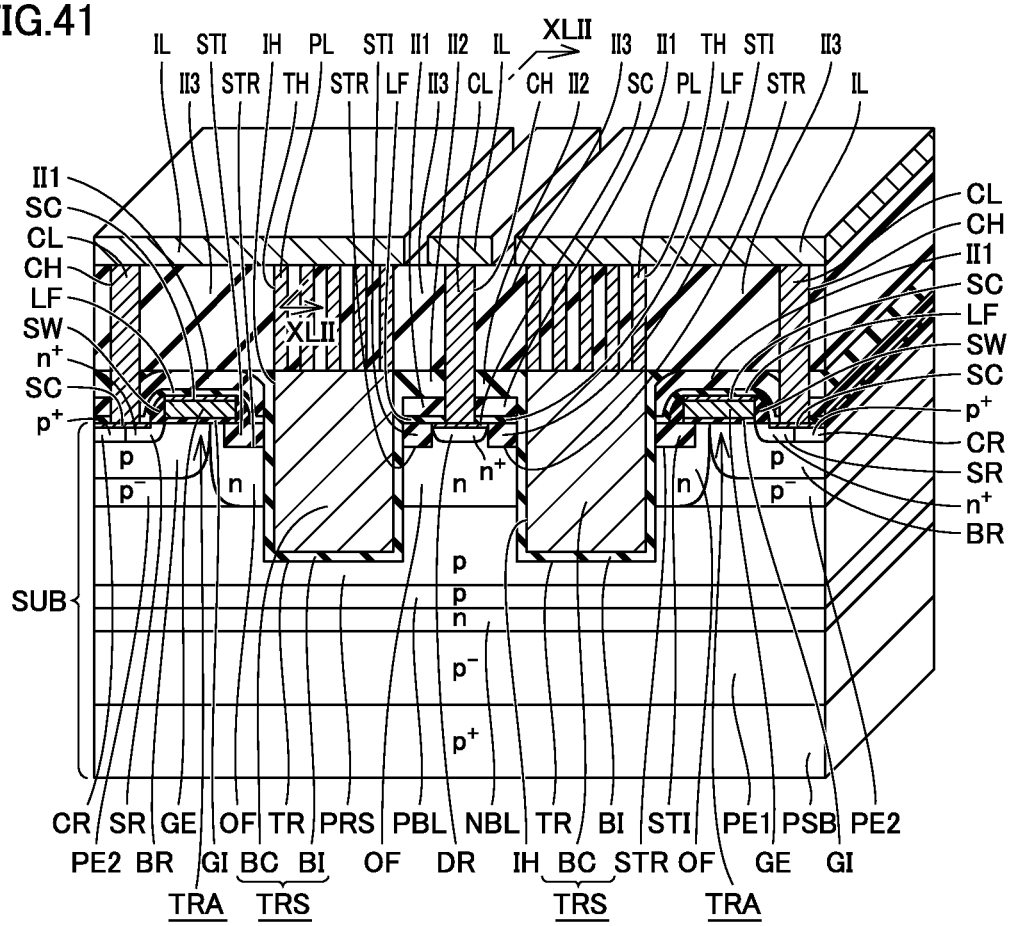
FIG. 41 is a schematic perspective view of a configuration of a semiconductor device in a sixth embodiment.
Figure 42:
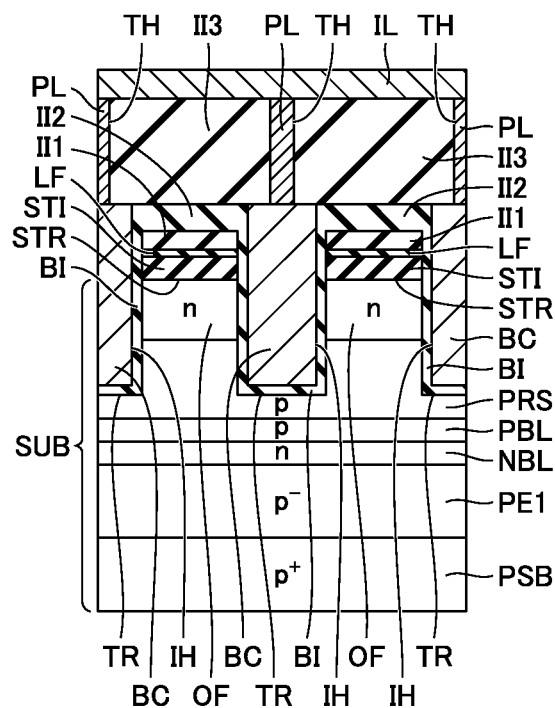
FIG. 42 is a schematic cross section taken along a line XLII-XLII shown in FIG. 41.
Figure 43:
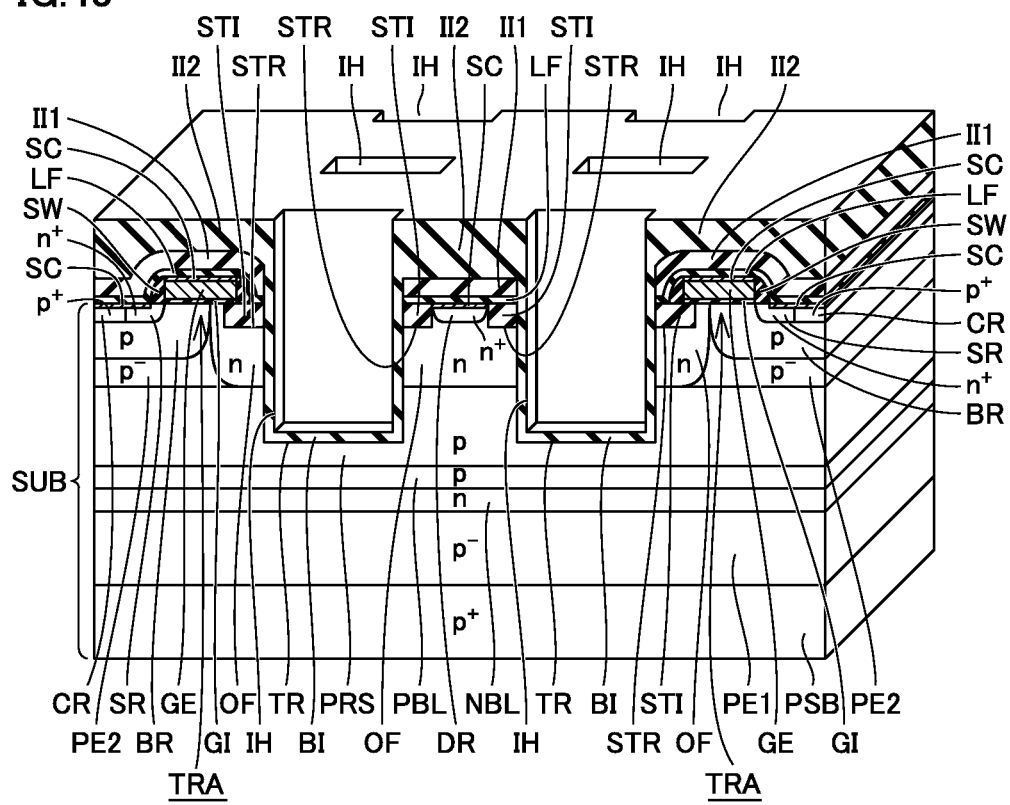
FIGS. 43-46 are schematic perspective views showing first to fourth steps, respectively, of a method for manufacturing the semiconductor device of the sixth embodiment.

With reference to FIG. 41 and FIG. 42, the present embodiment provides a configuration different from the FIGS. 9 and 10 configuration in that the former provides conducting layer BC made of doped polysilicon.

Conducting layer BC made of doped polysilicon is introduced into hole IH provided in interlayer insulating layer II2. An interlayer insulating layer II3 is formed on interlayer insulating layer II2 and conducting layer BC. Contact hole CH reaching silicide layer SC on $n^+$ drain region DR, and contact hole CH reaching silicide layer SC on $n^+$ source region SR penetrate interlayer insulating layers II1-II3 and liner insulating layer LF. These contact holes CH have conducting layer CL introduced therein.

Interlayer insulating layer II3 is provided with a through hole TH penetrating interlayer insulating layer II3 and thus reaching conducting layer BC. In through hole TH, a buried conducting layer PL is formed in contact with conducting layer BC.

Interconnect layer IL is formed on an upper surface of interlayer insulating layer II3. Interconnect layer IL electrically connects together conducting layer CL electrically connected to $n^+$ source region SR and buried conducting layer PL electrically connected to conducting layer BC.

Interconnect layer IL, conducting layer CL, and buried conducting layer PL are made of metal, e.g., tungsten, copper, aluminum, or the like.

Note that the configuration of the present embodiment other than the above is substantially the same as that shown in FIGS. 9 and 10, and accordingly, identical components are identically denoted and will not be described repeatedly.

Hereinafter will be described a method for manufacturing the semiconductor device of the present embodiment with reference to FIG. 43 to FIG. 46.

The method for manufacturing the semiconductor device of the present embodiment initially follows the steps similar to those shown in FIGS. 11-19. Thereafter, with reference to FIG. 43, normal photolithography and etching are employed to provide interlayer insulating layer II2 with hole IH. Hole IH is formed to extend from an upper surface of interlayer insulating layer II2 into trench TR while leaving interlayer insulating layer II2 on the side and bottom walls of trench TR.

Figure 44:
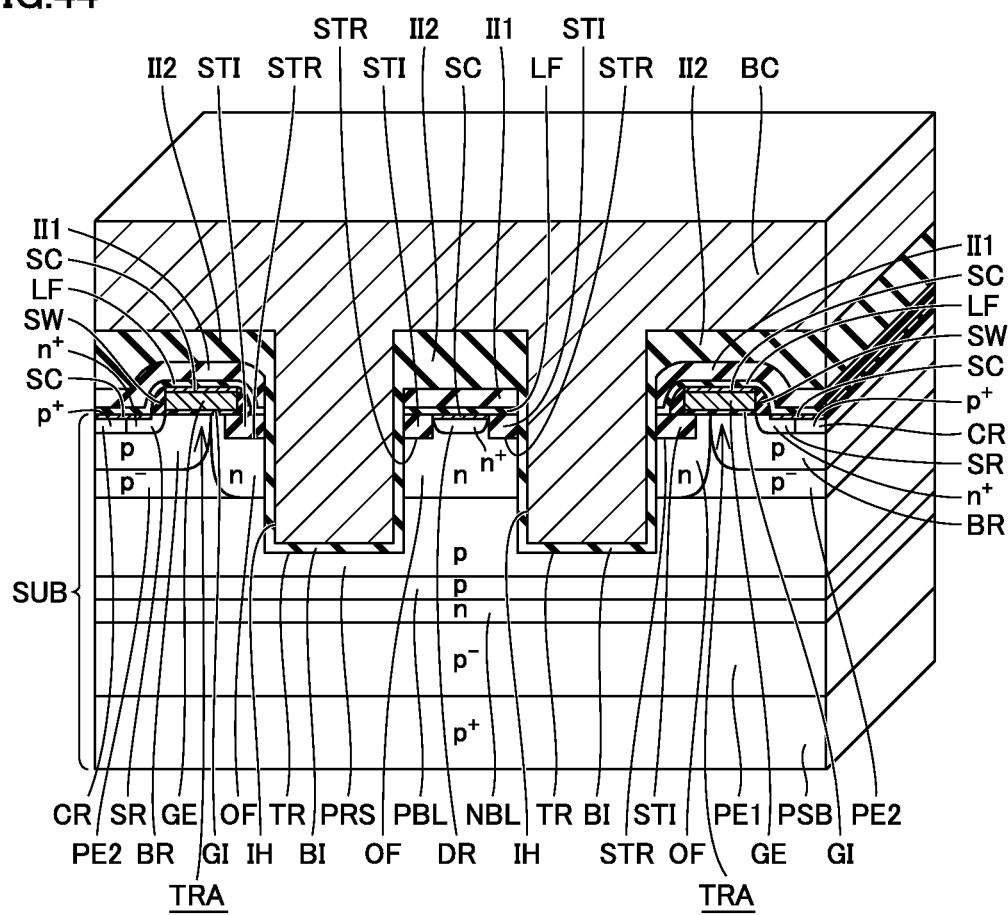

With reference to FIG. 44, for example CVD is employed to deposit conducting layer BC made for example of doped polysilicon on an upper surface of interlayer insulating layer II2 to bury the conducting layer in hole IH.

Figure 45:
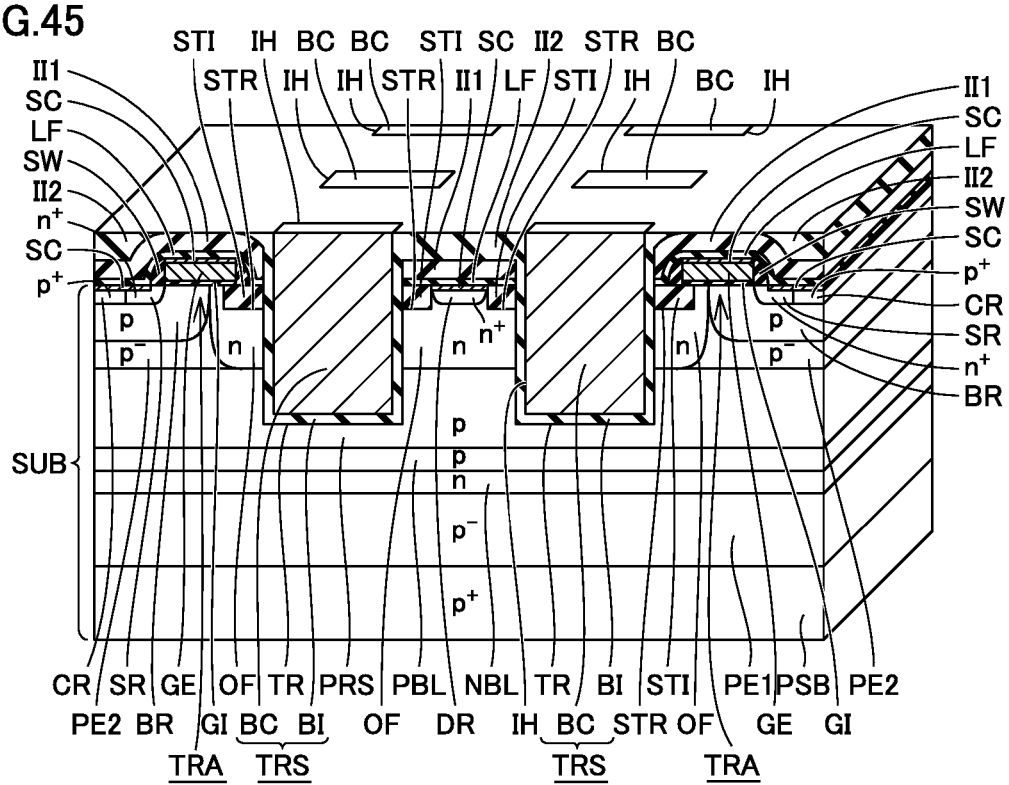

With reference to FIG. 45, etching back or CMP is employed to remove the conducting layer on the upper surface of interlayer insulating layer II2 while leaving conducting layer BC in hole IH. This provides conducting layer BC buried in hole IH.

Figure 46:
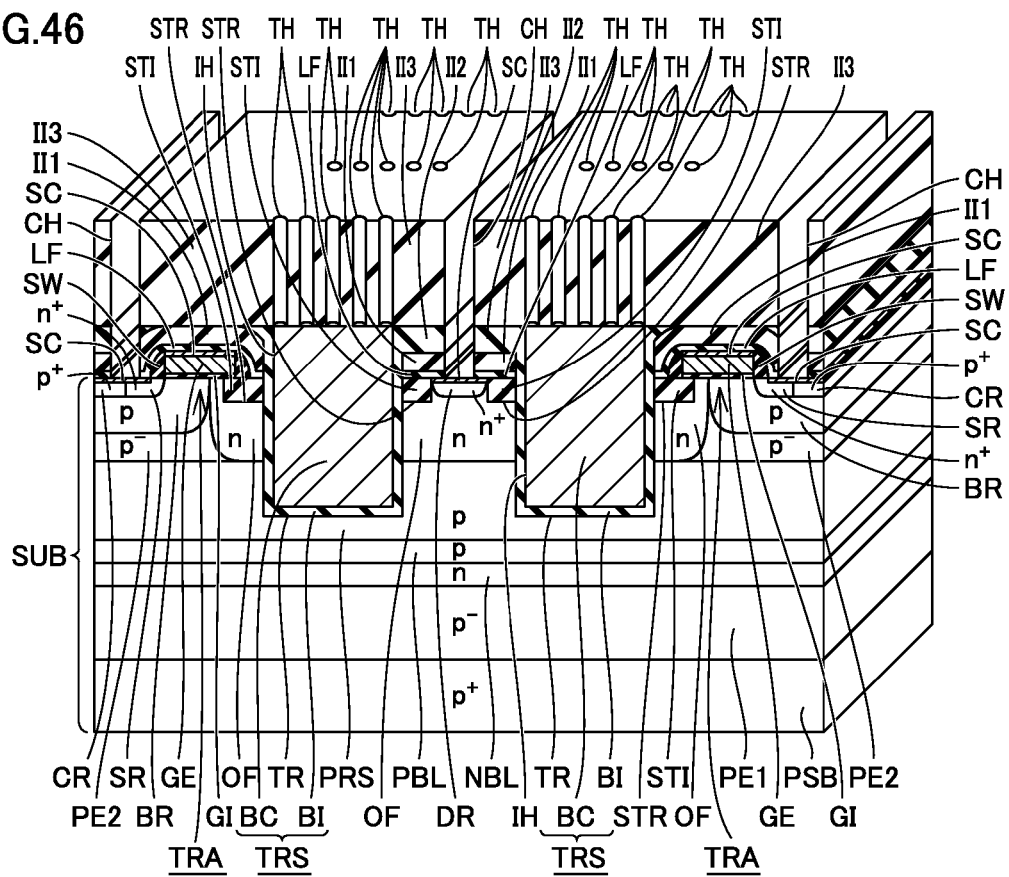

With reference to FIG. 46, interlayer insulating layer II3 is formed on interlayer insulating layer II2 and conducting layer BC. Normal photolithography and etching are employed to provide interlayer insulating layer II3 with contact hole CH and through hole TH. Contact hole CH is formed to reach both silicide layer SC on $n^+$ source region SR and $p^+$ contact region CR and silicide layer SC on $n^+$ drain region DR. Through hole TH is formed to reach conducting layer BC.

With reference to FIG. 41, conducting layer CL and buried conducting layer PL are provided to be buried in contact hole CH and through hole TH. Subsequently, interconnect layer IL is formed on an upper surface of interlayer insulating layer II3, and the semiconductor device of the present embodiment is thus produced.

The present embodiment provides a semiconductor device including a trench resurf structure having trench TR with conducting layer BC therein, and, as well as the first embodiment, allows reduced on resistance and enhanced breakdown voltage to be both established at a high level.

Furthermore, conducting layer BC made of doped polysilicon allows a production process to be set easier than conducting layer BC implemented as a metal layer does.

Furthermore, a trench portion configured of a plurality of trenches TR each formed to extend from the main surface of semiconductor substrate SUB deeply, as shown in FIGS. 9 and 10, increases the resurf effect. However, trench TR shallower than n type offset region OF and thus having a bottom wall located within n type offset region OF, as shown in FIGS. 47 and 48, also allows the resurf effect to be presented.

Figure 47:
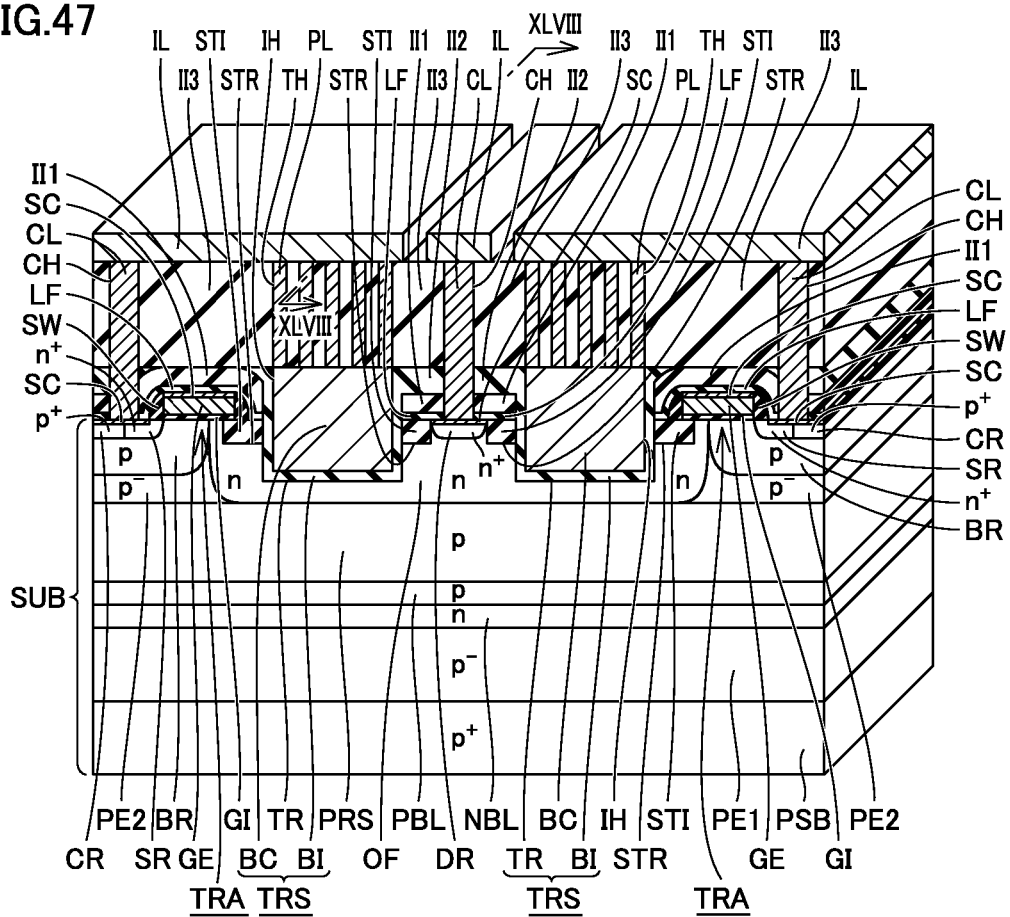
FIG. 47 is a schematic perspective view of the semiconductor device of the sixth embodiment in another configuration.
Figure 48:
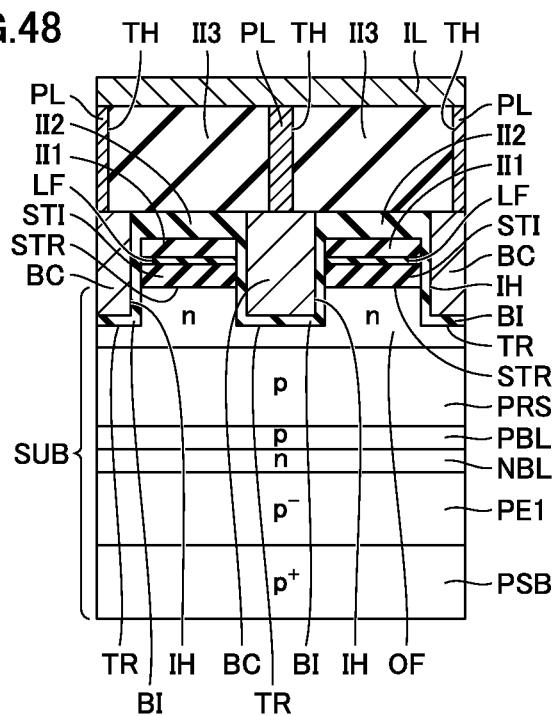
FIG. 48 is a schematic cross section taken along a line XLVIII-XLVIII shown in FIG. 47.

Note that the FIGS. 47 and 48 configuration other than the above is substantially the same as that shown in FIGS. 41 and 42, and accordingly, identical components are identically denoted and will not be described repeatedly.

Figure 49:
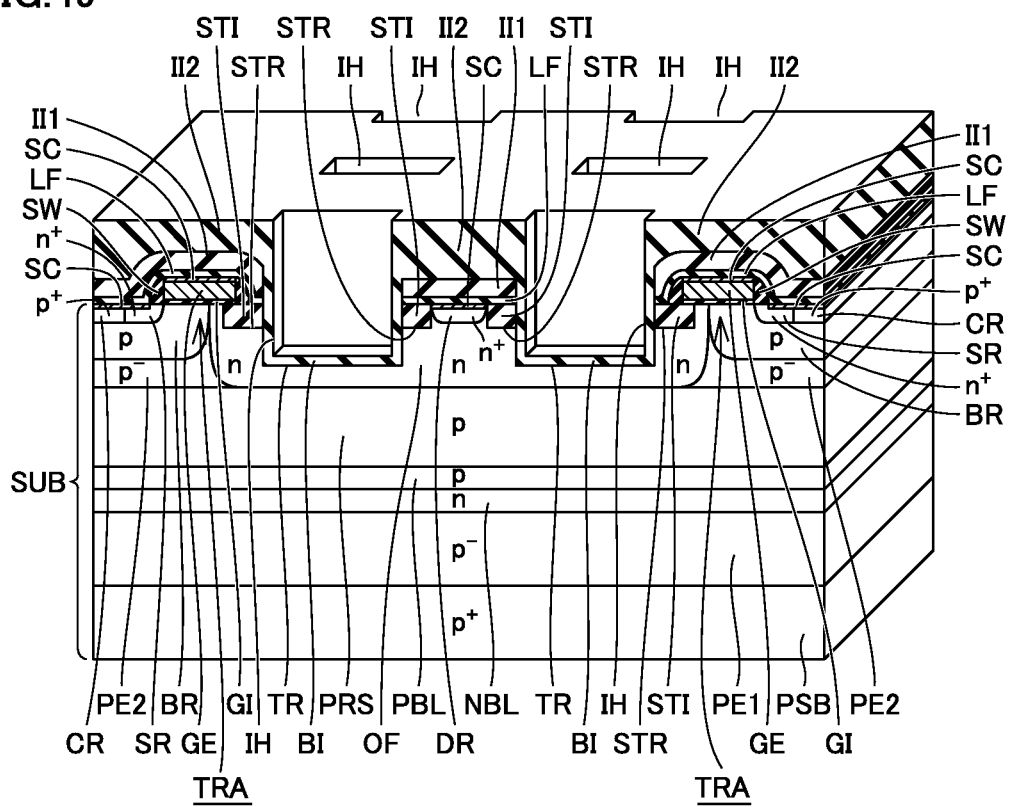
FIG. 49 is a schematic perspective view showing a method for manufacturing the semiconductor device of the sixth embodiment in the other configuration.

The configuration shown in FIG. 47 and FIG. 48 can be produced via controlling an etching to form trench TR so that trench TR is not deeper than n type offset region OF, as shown in FIG. 49. The remaining manufacturing steps are similar to those in the method of manufacturing the configuration shown in FIGS. 41 and 42, and accordingly, will not be described repeatedly.

The FIGS. 47 and 48 configuration, as well as the FIGS. 41 and 42 configuration, allows reduced on resistance and enhanced breakdown voltage to be both established at a high level and can also be produced through an easily set process.

Seventh Embodiment

Figure 50:
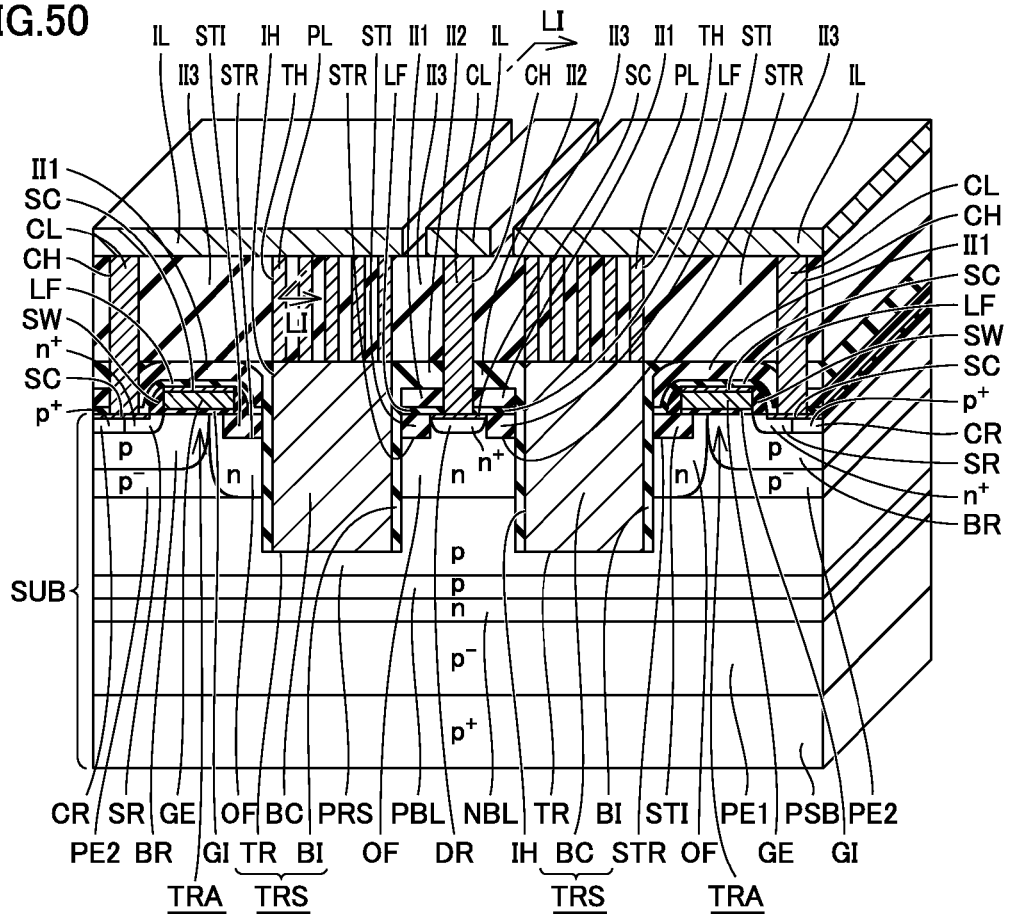
FIG. 50 is a schematic perspective view of a configuration of a semiconductor device in a seventh embodiment.
Figure 51:
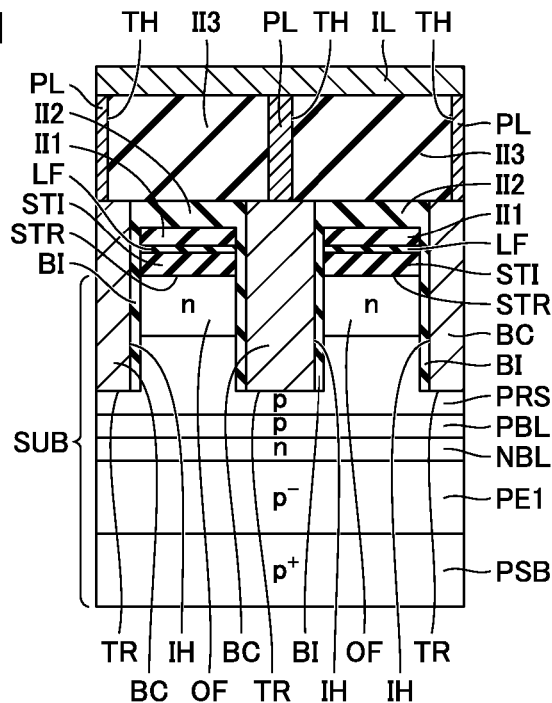
FIG. 51 is a schematic cross section taken along a line LI-LI shown in FIG. 50.

With reference to FIG. 50 and FIG. 51, the present embodiment provides a configuration different from the FIGS. 41 and 42 configuration in that the former provides conducting layer BC having a bottom surface in contact with p type resurf region PRS. While surrounding insulating layer BI covers a side surface of conducting layer BC, surrounding insulating layer BI does not cover the bottom surface of conducting layer BC. Accordingly, conducting layer BC has the bottom surface in contact with p type resurf region PRS, and conducting layer BC is thus electrically connected to p type resurf region PRS. As conducting layer BC is electrically connected to $n^+$ source region SR, p type resurf region PRS is also electrically connected to $n^+$ source region SR and thus has a source potential.

Note that the configuration of the present embodiment other than the above is substantially the same as that shown in FIGS. 41 and 42, and accordingly, identical components are identically denoted and will not be described repeatedly.

Figure 52:
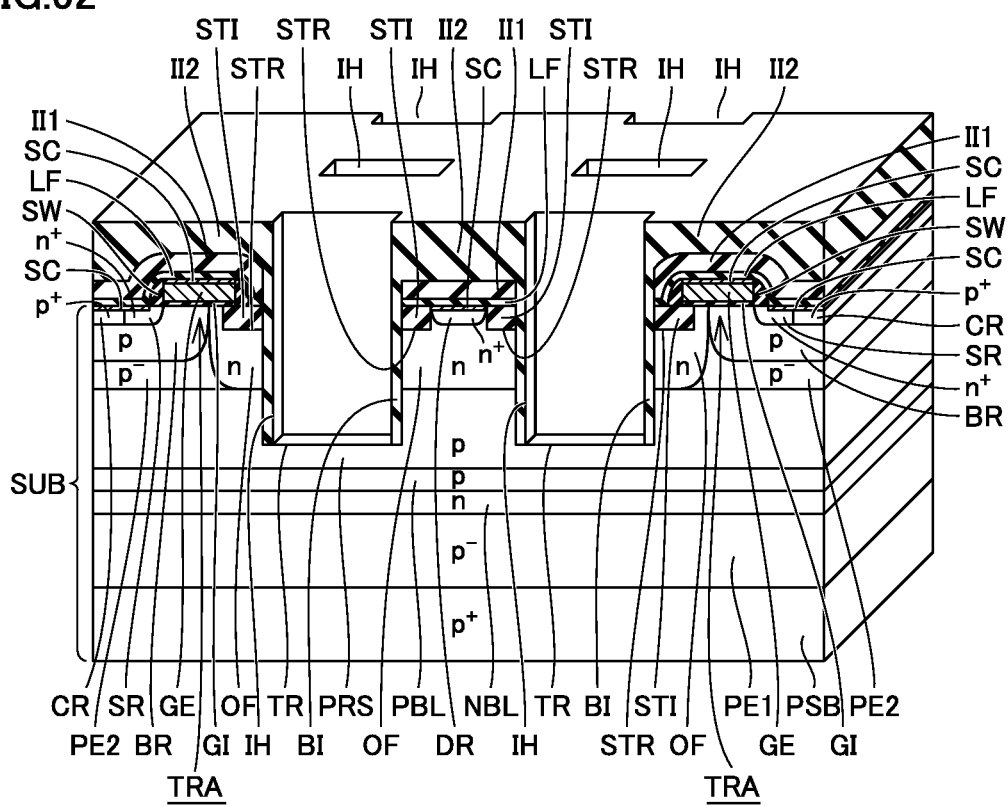
FIG. 52 is a schematic perspective view showing a method for manufacturing the semiconductor device of the seventh embodiment.

The FIGS. 50 and 51 configuration can be produced via controlling an etching to form hole IH to allow hole IH to extend through interlayer insulating layer II2 and penetrate the bottom of trench TR to reach p type resurf region PRS, as shown in FIG. 52. The remaining manufacturing steps are similar to those in the method of manufacturing the configuration shown in FIGS. 41 and 42, and accordingly, will not be described repeatedly.

The present embodiment provides a semiconductor device including trench resurf structure TRS having trench TR with conducting layer BC therein, as shown in FIG. 50 and FIG. 51. Thus, the present embodiment, as well as the first embodiment, allows reduced on resistance and enhanced breakdown voltage to be both established at a high level.

Furthermore, p type resurf region PRS is electrically connected to conducting layer BC, and thus fixed to a source potential. This uniformly spaces isoelectric lines passing through a depletion layer provided when n type offset region OF is depleted, as shown in FIG. 28. This can alleviate the electric field concentration near the junction of n type offset region OF and p type body region BR and thus allows reduced on resistance and enhanced breakdown voltage to be both established at a further higher level.

Furthermore, conducting layer BC is made of doped polysilicon. When conducting layer BC made of doped polysilicon is compared with conducting layer BC made of metal, the former can be connected to semiconductor substrate SUB made of a silicon-containing material (e.g., silicon) with low resistance more easily.

Eighth Embodiment

Figure 53:
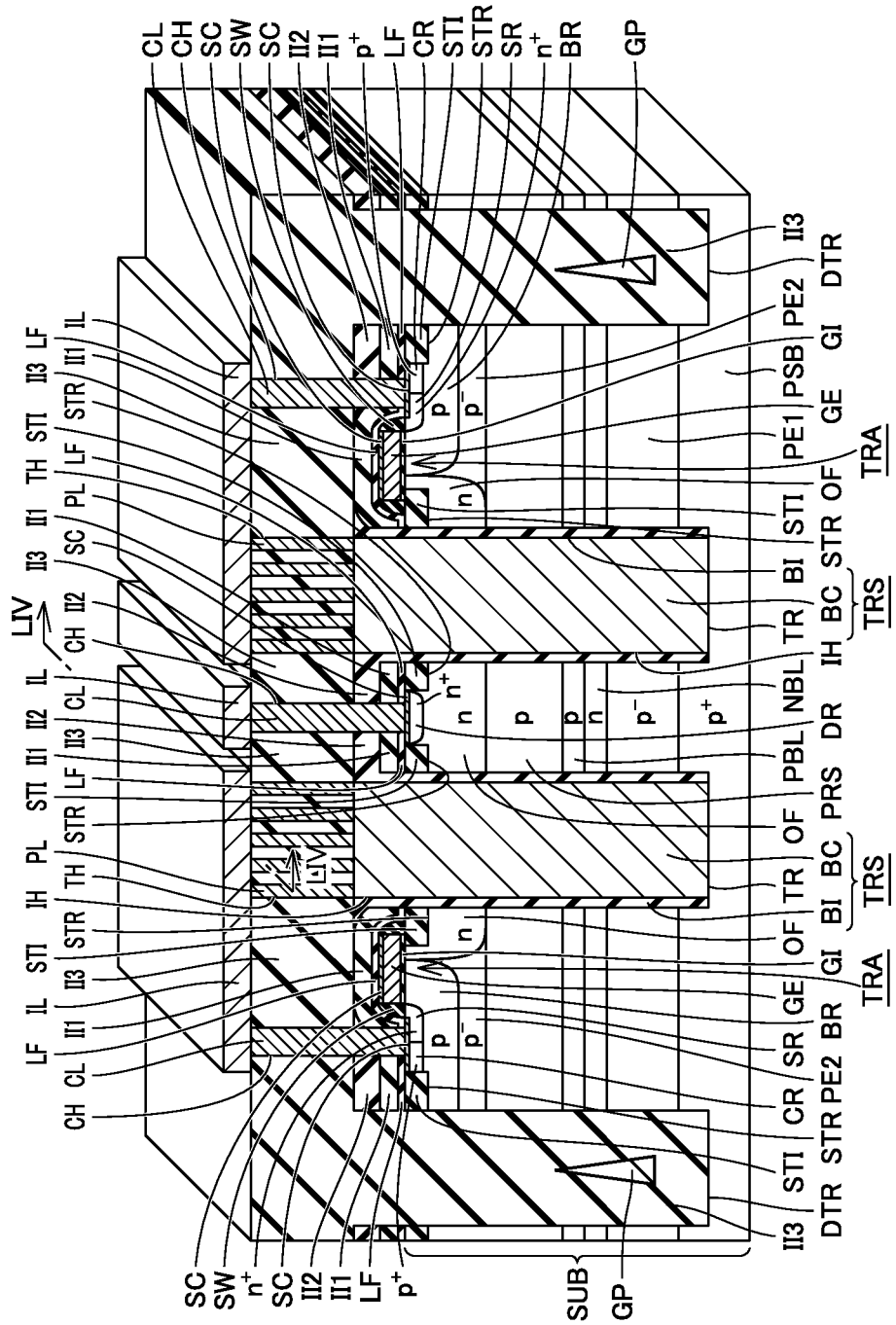
FIG. 53 is a schematic perspective view of a configuration of a semiconductor device in an eighth embodiment.
Figure 54:
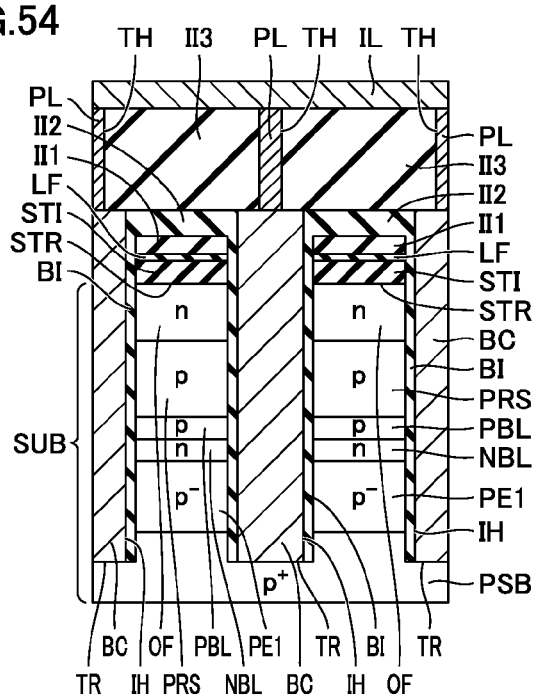
FIG. 54 is a schematic cross section taken along a line LIV-LIV shown in FIG. 53.

With reference to FIGS. 53 and 54, the present embodiment provides a configuration which, as compared with the FIGS. 41 and 42 configuration, has trench TR penetrating a device isolating impurity region, or n type buried region NBL and p type buried region PBL, and thus connected to $p^+$ substrate region PSB or $p^-$ epitaxial region PE1 located under n type buried region NBL.

In particular, for lateral MOS transistor TRA formed in $p^-$ epitaxial region PE2, n type buried region NBL substantially has a role of electrically isolating lateral MOS transistor TRA from other devices.

Conducting layer BC has a bottom surface in contact with $p^+$ substrate region PSB or $p^-$ epitaxial region PE1 at the bottom of trench TR. While surrounding insulating layer BI covers a side surface of conducting layer BC, surrounding insulating layer BI does not cover the bottom surface of conducting layer BC. Accordingly, conducting layer BC has the bottom surface in contact with $p^+$ substrate region PSB or $p^-$ epitaxial region PE1, and conducting layer BC is thus electrically connected to $p^+$ substrate region PSB or $p^-$ epitaxial region PE1. As conducting layer BC is electrically connected to $n^+$ source region SR, $p^+$ substrate region PSB or $p^-$ epitaxial region PE1 is also electrically connected to $n^+$ source region SR and thus has a source potential.

Furthermore, as seen in a plan view, semiconductor substrate SUB has deep trench DTR formed therein to surround lateral MOS transistor TRA. Deep trench DTR penetrates n type buried region NBL and p type buried region PBL and thus reaches $p^+$ substrate region PSB or $p^-$ epitaxial region PE1 located under n type buried region NBL. Deep trench DTR has interlayer insulating layer II2 introduced therein. Lateral MOS transistor TRA has a side portion surrounded by deep trench DTR having interlayer insulating layer II2 introduced therein and has a lower portion covered with n type buried region NBL, and lateral MOS transistor TRA is thus electrically isolated from other devices.

Note that the configuration of the present embodiment other than the above is substantially the same as that shown in FIGS. 41 and 42, and accordingly, identical components are identically denoted and will not be described repeatedly.

The present embodiment provides a semiconductor device including a trench resurf structure having trench TR with conducting layer BC therein, and, as well as the first embodiment, allows reduced on resistance and enhanced breakdown voltage to be both established at a high level.

Furthermore, conducting layer BC that is in contact with p⁺ substrate region PSB or p⁻ epitaxial region PE1 allows p⁺ substrate region PSB or p⁻ epitaxial region PE1 to be fixed to a source potential.

Furthermore, conducting layer BC is made of doped polysilicon. When conducting layer BC made of doped polysilicon is compared with conducting layer BC made of metal, the former can be connected to semiconductor substrate SUB made of a silicon-containing material (e.g., silicon) with low resistance more easily.

Figure 60:
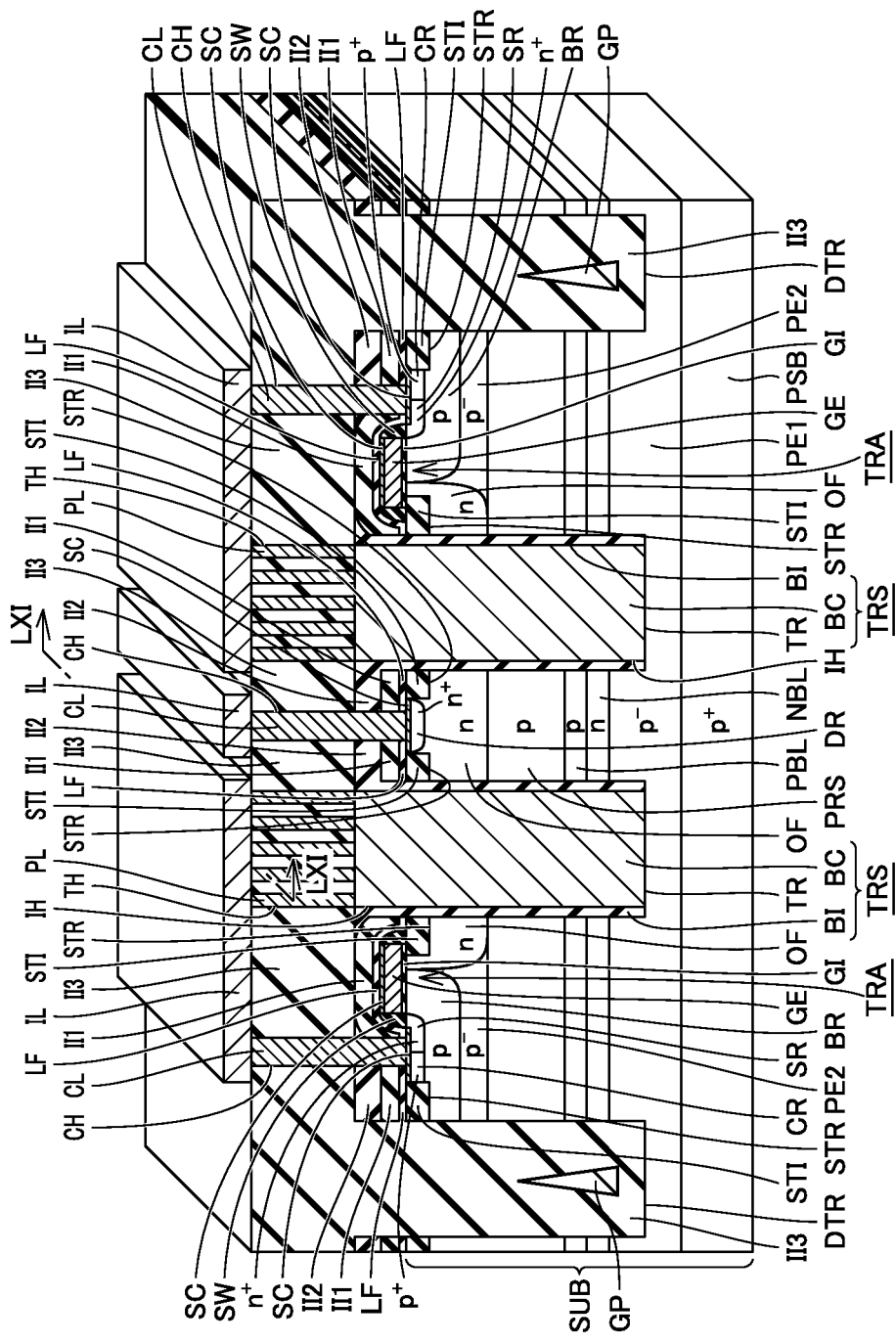
FIG. 60 is a schematic perspective view of the semiconductor device of the eighth embodiment with a conducting layer in contact with p$^-$ epitaxial region PE1.
Figure 61:
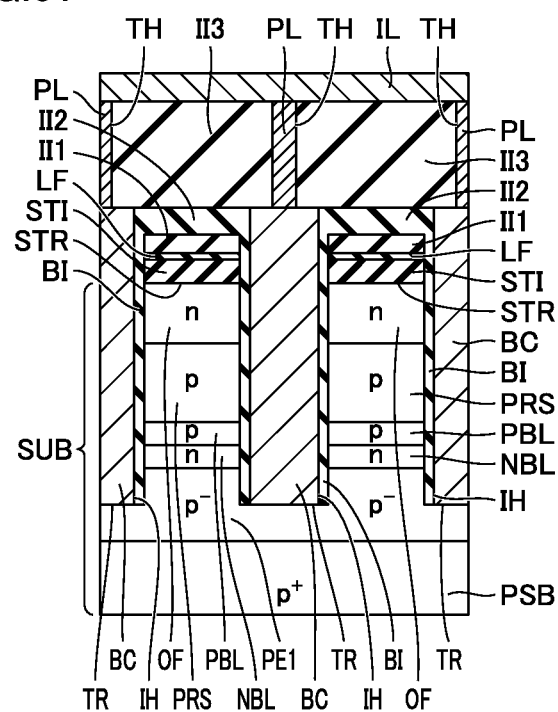
FIG. 61 is a schematic cross section taken along a line LXI-LXI shown in FIG. 60.

Furthermore, while the FIG. 53 and FIG. 54 configuration has trench TR having conducting layer BC therein with a bottom surface in contact with p⁺ substrate region PSB, trench TR may alternatively have conducting layer BC therein with a bottom surface in contact with p⁻ epitaxial region PE1, as shown in FIG. 60 and FIG. 61. This provides trench TR shallower than the FIG. 53 and FIG. 54 configuration and is thus advantageous in terms of cost. Furthermore, the FIG. 60 and FIG. 61 configuration can be produced via forming trench TR to form trench TR and deep trench DTR to be shallow to reach p⁻ epitaxial region PE1.

Ninth Embodiment

Figure 55:
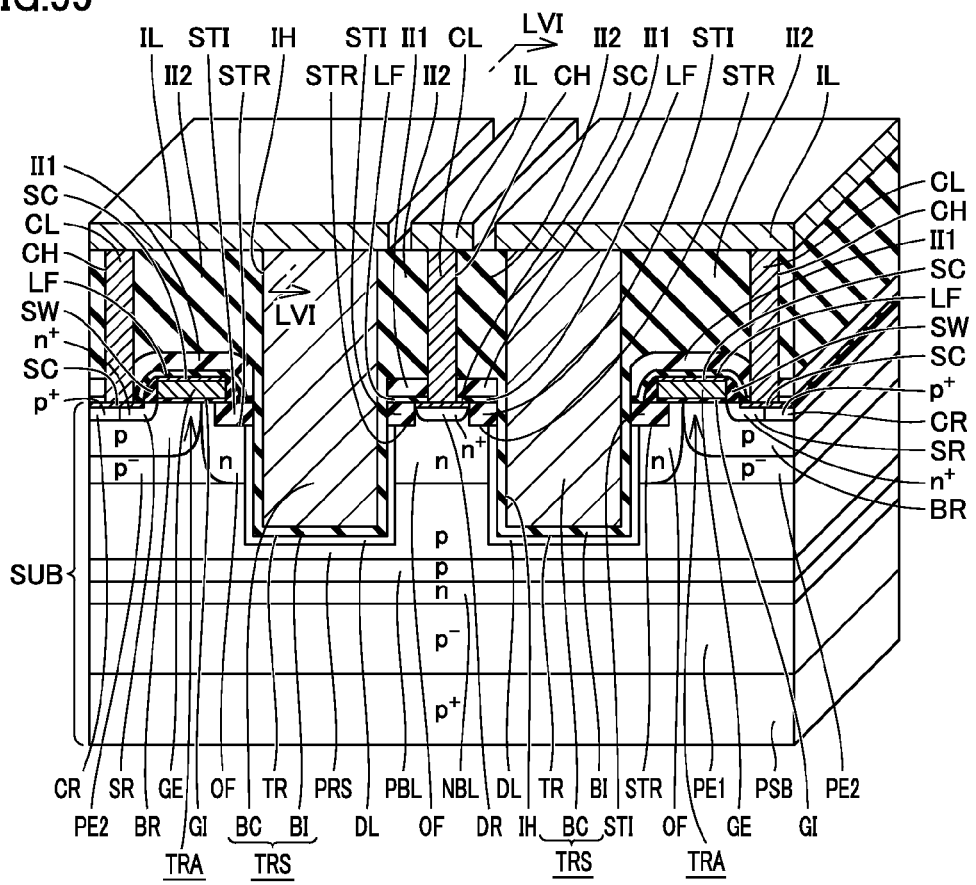
FIG. 55 is a schematic perspective view of a configuration of a semiconductor device in a ninth embodiment.
Figure 56:
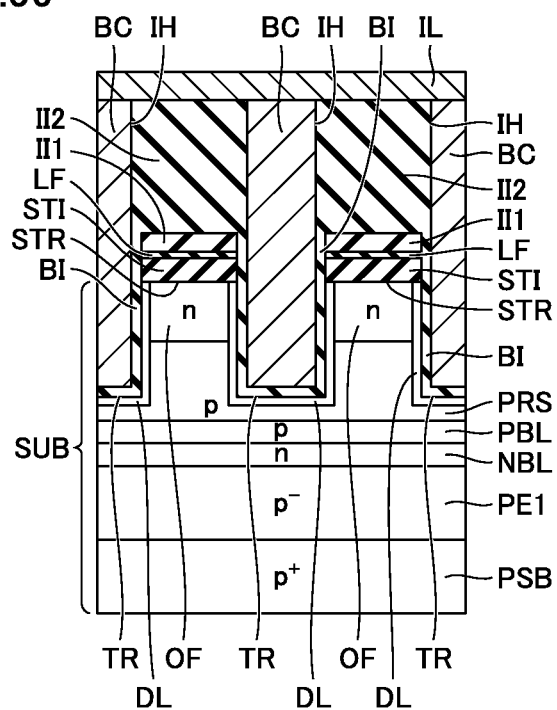
FIG. 56 is a schematic cross section taken along a line LVI-LVI shown in FIG. 55.

With reference to FIG. 55 and FIG. 56, the present embodiment provides a configuration different from the FIGS. 9 and 10 configuration in that the former has trench TR surrounded by a p type peripheral region PEL of a conduction type opposite to that of n type offset region OF.

Note that the configuration of the present embodiment other than the above is substantially the same as that shown in FIGS. 9 and 10, and accordingly, identical components are identically denoted and will not be described repeatedly.

Figure 57:
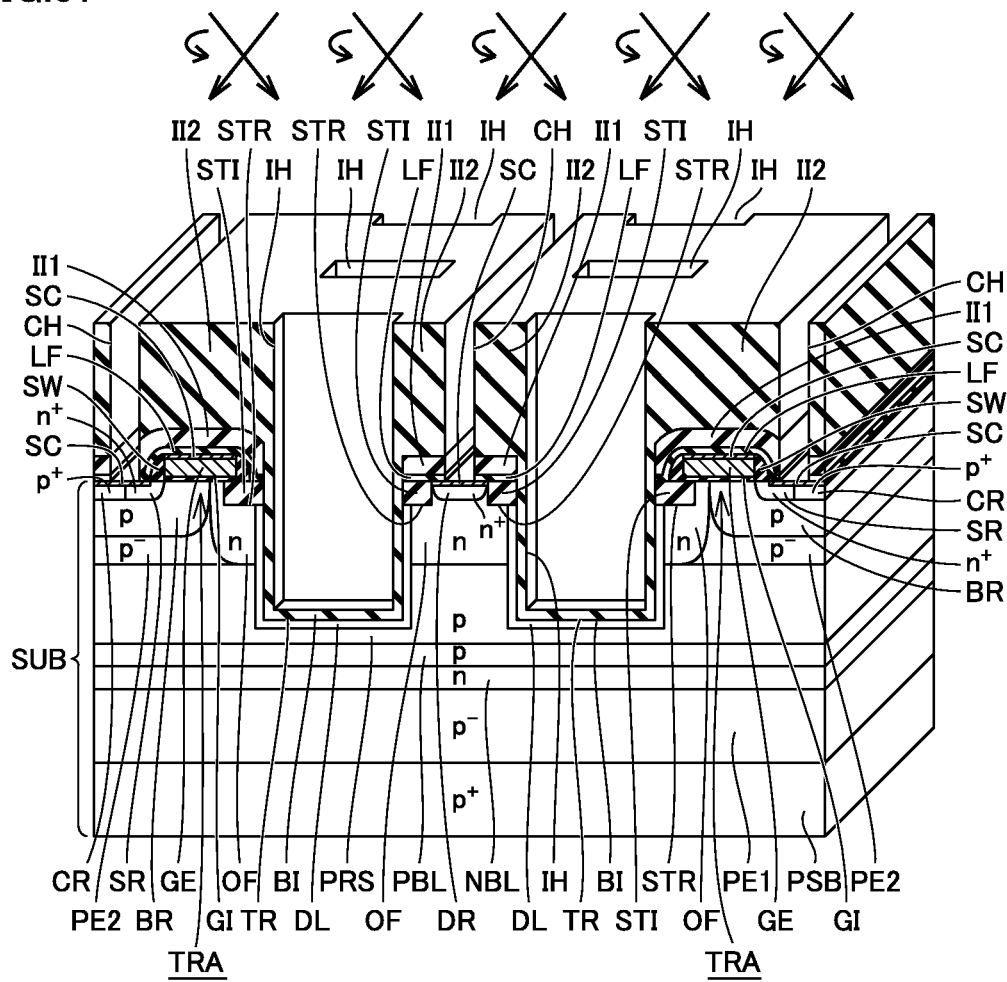
FIG. 57 is a schematic perspective view showing a method for manufacturing the semiconductor device of the ninth embodiment.

The FIG. 55 and FIG. 56 configuration can be produced via forming hole IH and thereafter for example obliquely, rotationally injecting p type impurity ions to form p type peripheral region PEL, as shown in FIG. 57. The remaining manufacturing steps are similar to those in the method of manufacturing the configuration shown in FIGS. 9 and 10, and accordingly, will not be described repeatedly.

The present embodiment provides a semiconductor device including a trench resurf structure having trench TR with conducting layer BC therein, and, as well as the first embodiment, allows reduced on resistance and enhanced breakdown voltage to be both established at a high level.

Furthermore, trench TR is surrounded by p type peripheral region PEL of a conduction type opposite to that of n type offset region OF. This allows a portion of n type offset region OF that has not been successfully depleted around trench TR to be depleted as p type peripheral region PEL exists. This allows a depletion layer to be enlarged and electric field concentration to be alleviated, and the resurf effect to be further enhanced.

While the above embodiments have been described for p type resurf region PRS formed under the entirety of a lateral MOS transistor TRA formation region, p type resurf region PRS may not be formed under the entirety of the lateral MOS transistor TRA formation region. For example, p type resurf region PRS may be absent immediately under n⁺ drain region DR of lateral MOS transistor TRA. While the absence of p type resurf region PRS immediately under n⁺ drain region DR results in p type resurf region PRS presenting a reduced resurf effect, enhanced breakdown voltage can be expected.

While the above embodiments have been described for lateral MOS transistor TRA, gate insulating layer GI is not limited to silicon oxide film, and may be a different insulating layer. Accordingly, lateral MOS transistor TRA may be a lateral metal insulator semiconductor (MIS) transistor.

Furthermore, while the above embodiments have been described for an n-type channel MOS transistor, the configurations of the above embodiments are similarly applicable to a p type channel MOS transistor.

Furthermore, while the above embodiments have been described for a configuration with silicide layer SC, the above embodiments may dispense with silicide layer SC. In that case, for example with reference for example to FIG. 9, conducting layer CL buried in contact hole CH is directly connected to both n⁺ source region SR and p⁺ contact region CR, and conducting layer CL buried in another contact hole CH is directly connected to n⁺ drain region DR.

Furthermore, the above embodiments may be combined as appropriate.

While the present invention made by the present inventors have been described specifically based on embodiments, the present invention is not limited to the embodiments and can be variously modified without departing from its gist.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a semiconductor substrate having a main surface;
   a source region formed in said main surface of said semiconductor substrate;
   a drain region formed in said main surface and separated from said source region;
   an offset region formed in said main surface between said drain region and said source region, and separated from said source region;
   a gate electrode formed on said main surface and opposite to a region sandwiched between said source region and said offset region;
   a trench portion formed in said main surface in said offset region and extending in a direction from said drain region toward said source region; and
   a conducting layer formed in said trench portion and extending in said main surface in said direction from said drain region toward said source region.

2. The semiconductor device according to claim 1, further comprising a surrounding insulating layer formed in said trench portion and surrounding said conducting layer.

3. The semiconductor device according to claim 2, wherein said surrounding insulating layer covers a side surface of said conducting layer and said conducting layer has a bottom surface in contact with said semiconductor substrate.

4. The semiconductor device according to claim 3, further comprising a resurf region formed in contact with a lower side of said offset region and being of a conduction type opposite to that of said offset region, wherein said resurf region is connected to said bottom surface of said conducting layer.

5. The semiconductor device according to claim 3, further comprising a device isolating impurity region formed under said offset region to electrically isolate an insulated gate field effect transistor having said drain region, said source region and said gate electrode from another device, wherein said conducting layer penetrates said device isolating impurity region and is connected to a region of said semiconductor substrate located under said device isolating impurity region.

6. The semiconductor device according to claim 2, wherein said surrounding insulating layer covers a side surface of said conducting layer and a bottom surface of said conducting layer to allow said conducting layer to be out of contact with said semiconductor substrate.

7. The semiconductor device according to claim 1, further comprising a buried insulating layer buried in said trench portion at a side of said conducting layer closer to said drain region.

8. The semiconductor device according to claim 1, wherein, as seen on said main surface, there are a first distance between an end of said conducting layer closer to said drain region and an end of said trench portion closer to said drain region and a second distance between an end of said conducting layer closer to said source region and an end of said trench portion closer to said source region, said first distance being larger than said second distance.

9. The semiconductor device according to claim 1, further comprising a surrounding region surrounding said trench portion and being of a conduction type opposite to that of said offset region.

10. The semiconductor device according to claim 1, wherein said trench portion penetrates said offset region and has a bottom wall under said offset region.

11. The semiconductor device according to claim 1, wherein said trench portion has a bottom wall in said offset region.

12. The semiconductor device according to claim 1, wherein said conducting layer is configured such that a fixed potential is applied thereto.

13. The semiconductor device according to claim 1, wherein said conducting layer is electrically connected to said source region.

14. The semiconductor device according to claim 1, wherein said conducting layer is made of polycrystalline silicon having an impurity introduced therein.

15. The semiconductor device according to claim 1, wherein:

said trench portion has a plurality of trenches; and
said plurality of trenches are provided in said main surface, and separated from one another and run parallel to one another.

16. A method for manufacturing a semiconductor device, comprising the steps of:

fabricating in a semiconductor substrate an insulated gate field effect transistor having a source region located in a main surface of said semiconductor substrate, a drain region located in said main surface and separated from said source region, an offset region located in said main surface between said drain region and said source region and separated from said source region, and a gate electrode located on said main surface and opposite to a region sandwiched between said source region and said offset region;

forming a trench portion in said offset region to extend in a direction from said drain region toward said source region in said main surface;

forming an insulating layer on said main surface, on a side wall of said trench portion and on a bottom wall of said trench portion to cover said insulated gate field effect transistor and be buried in said trench portion;

forming a hole in said insulating layer to extend from an upper surface of said insulating layer into said trench portion while leaving said insulating layer on said side wall of said trench portion; and burying a conducting layer in said hole.

17. The method for manufacturing a semiconductor device according to claim 16, wherein said hole is formed to reach said semiconductor substrate at said bottom wall of said trench portion and said conducting layer is formed in contact with said semiconductor substrate at said bottom wall of said trench portion.

18. The method for manufacturing a semiconductor device according to claim 16, further comprising the step of forming a surrounding region surrounding said trench portion and being of a conduction type opposite to that of said offset region after said hole is formed and before said conducting layer is buried.

* * * * *